(12) United States Patent
Koo et al.

(10) Patent No.: US 9,627,509 B2
(45) Date of Patent: Apr. 18, 2017

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Kyungbum Koo, Yongin-si (KR); Wandon Kim, Yongin-si (KR); Sangjin Hyun, Suwon-si (KR); Shinhye Kim, Suwon-si (KR); TaekSoo Jeon, Yongin-si (KR); Byung-Suk Jung, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 14/802,519

(22) Filed: Jul. 17, 2015

(65) Prior Publication Data

US 2016/0020294 A1    Jan. 21, 2016

(30) Foreign Application Priority Data

Jul. 21, 2014  (KR) .................. 10-2014-0091964

(51) Int. Cl.
| | |
|---|---|
| *H01L 29/66* | (2006.01) |
| *H01L 29/78* | (2006.01) |
| *H01L 29/51* | (2006.01) |
| *H01L 21/768* | (2006.01) |
| *H01L 21/02* | (2006.01) |

(52) U.S. Cl.
CPC .. *H01L 29/66545* (2013.01); *H01L 21/02362* (2013.01); *H01L 21/76829* (2013.01); *H01L 21/76832* (2013.01); *H01L 21/76834* (2013.01); *H01L 29/51* (2013.01); *H01L 29/511* (2013.01); *H01L 29/66636* (2013.01); *H01L 29/78* (2013.01); *H01L 29/512* (2013.01); *H01L 29/513* (2013.01); *H01L 29/517* (2013.01); *H01L 2029/7858* (2013.01)

(58) Field of Classification Search
None
See application file for complete search history.

(56) References Cited

U.S. PATENT DOCUMENTS

| 4,404,732 A | * | 9/1983 | Andrade ............. H01L 29/0891 |
| | | | 148/DIG. 100 |
| 7,397,131 B2 | | 7/2008 | Kim et al. |
| | | (Continued) | |

FOREIGN PATENT DOCUMENTS

| KR | 10-2004-0061857 A | 7/2004 |
| KR | 10-2006-0133700 A | 12/2006 |
| KR | 10-2008-0060303 A | 7/2008 |

*Primary Examiner* — Phat X Cao
*Assistant Examiner* — Diana C Vieira
(74) *Attorney, Agent, or Firm* — Sughrue Mion, PLLC

(57) ABSTRACT

Provided are a semiconductor device and a method of fabricating the same. The semiconductor device may include a substrate with an active pattern, a gate electrode provided at the active pattern, and a gate capping structure disposed above the gate electrode. The gate capping structure may include two or more gate capping patterns with different properties from each other, and the use of the gate capping structure makes it possible to form contact plugs in a self-aligned manner and improve operational speed and characteristics of the semiconductor device.

16 Claims, 17 Drawing Sheets

(56) References Cited

U.S. PATENT DOCUMENTS

| | | | |
|---|---|---|---|
| 7,592,213 B2* | 9/2009 | Datta | H01L 21/823807 257/E21.632 |
| 7,986,012 B2 | 7/2011 | Matsubara et al. | |
| 8,426,300 B2 | 4/2013 | Ramachandran et al. | |
| 8,536,656 B2 | 9/2013 | Ramachandran et al. | |
| 8,629,014 B2 | 1/2014 | Kwon et al. | |
| 9,034,703 B2* | 5/2015 | Cheng | H01L 21/28079 438/197 |
| 9,105,497 B2* | 8/2015 | Hong | H01L 27/092 |
| 2006/0192255 A1 | 8/2006 | Kim et al. | |
| 2006/0258176 A1* | 11/2006 | Fukazawa | B05D 1/62 438/787 |
| 2008/0173981 A1* | 7/2008 | Chinthakindi | H01L 23/5223 257/535 |
| 2009/0159978 A1 | 6/2009 | Matsubara et al. | |
| 2012/0068261 A1 | 3/2012 | Kwon et al. | |
| 2012/0139061 A1* | 6/2012 | Ramachandran | H01L 21/76895 257/410 |
| 2012/0175711 A1 | 7/2012 | Ramachandran et al. | |
| 2013/0043516 A1 | 2/2013 | Han et al. | |
| 2013/0093104 A1* | 4/2013 | Wu | H01L 23/291 257/782 |
| 2014/0061799 A1 | 3/2014 | Fan et al. | |
| 2015/0364326 A1* | 12/2015 | Xie | H01L 21/28008 257/288 |

* cited by examiner

SEMICONDUCTOR DEVICE AND METHOD OF FABRICATING THE SAME

CROSS-REFERENCE TO THE RELATED APPLICATIONS

This application claims priority from Korean Patent Application No. 10-2014-0091964, filed on Jul. 21, 2014, in the Korean Intellectual Property Office, the entire contents of which are hereby incorporated herein by reference.

BACKGROUND

Example embodiments of the inventive concept relate to a semiconductor device and a method of fabricating the same, and in particular, to a semiconductor device with a field effect transistor (FET) and a method of fabricating the same.

Semiconductor devices are increasingly being used in consumer, commercial and other electronic devices. The semiconductor devices may be classified into a memory device for storing data, a logic device for processing data, and a hybrid device including both of memory and logic elements. To meet the increased demand for electronic devices with fast speed and/or low power consumption, it is necessary to realize semiconductor devices with high reliability, high performance, and/or multiple functions. To satisfy these technical requirements, complexity and/or integration density of semiconductor devices are being increased.

SUMMARY

Example embodiments of the inventive concept provide a semiconductor device, in which a field effect transistor with improved electric characteristics is provided.

Example embodiments of the inventive concept also provide a method of fabricating a semiconductor device, in which a field effect transistor with improved electric characteristics is provided.

According to an example embodiment of the inventive concept, a semiconductor device may include a substrate with an active pattern, a gate electrode provided at the active pattern, and a gate capping structure disposed above the gate electrode. The gate capping structure may include a first gate capping pattern and a second gate capping pattern sequentially stacked on the gate electrode. The first gate capping pattern may include a horizontally-extended portion extending parallel to a top surface of the substrate and vertically-extended portions extending upward from both edges of the horizontally-extended portion. The second gate capping pattern may have a lower density than the first gate capping pattern.

The vertically-extended portions may be continuously connected to the horizontally-extended portion to form a single body.

A bottom surface of the second gate capping pattern may be in contact with a top surface of the horizontally-extended portion, and side surfaces of the second gate capping pattern may be in contact with the vertically-extended portions, respectively.

The semiconductor device may further include contact plugs provided at both sides of the gate electrode. At least one of the vertically-extended portions may have a top surface in contact with at least one of the contact plugs.

At least one of the contact plugs may be overlapped with at least one of the vertically-extended portions and may be disposed spaced apart from the second gate capping pattern in a plan view.

The semiconductor device may further include a gate dielectric layer interposed between the gate electrode and the substrate, and epitaxial patterns provided on portions of the active pattern at both sides of the gate electrode. The contact plugs may be connected to the epitaxial patterns, respectively.

The semiconductor device may further include spacer structures provided on both sidewalls of the gate electrode. The vertically-extended portions may be respectively interposed between the second gate capping pattern and the spacer structures.

The first gate capping pattern may be formed of a material having a higher dielectric constant than the second gate capping pattern.

The second gate capping pattern may be formed of a material having a higher dielectric constant than the first gate capping pattern.

The second gate capping pattern may include a fluorine-containing material, and a fluorine concentration may be lower in the first gate capping pattern than in the second gate capping pattern.

The device may further include an active fin provided on a top surface of the active pattern. The gate electrode may be provided to cross the active fin, and the gate dielectric layer may extend along a bottom surface of the gate electrode and cover top and side surfaces of the active fin.

The active fin may be positioned between the epitaxial patterns and below the gate electrode. The gate electrode may include first portions facing both sidewalls of the active fin and a second portion provided on the active fin to connect the first portions to each other.

According to an example embodiment of the inventive concept, a semiconductor device may include a substrate of a first conductive type, a gate electrode formed at the substrate, a gate capping structure disposed above the gate electrode, an interlayer dielectric layer disposed above the gate capping structure, a contact plug disposed at a side of the gate electrode, and a drain pattern and a source pattern disposed at the substrate separately from the gate electrode. Here, the gate capping structure may be disposed to electrically and spatially separate the gate electrode from the contact plug.

The drain pattern and the source pattern may be disposed on an active pattern of the substrate, and a material forming the drain pattern and the source pattern may have a lattice constant different from the active pattern.

The interlayer dielectric layer may include a silicon-oxide layer, and the gate capping structure may include at least one of SiON, SiCN, SiCON or SiN.

The gate capping structure may include a first gate capping pattern and a second gate capping pattern sequentially stacked on the gate electrode, and the first gate capping pattern may include a material having a higher dielectric constant and higher density than the second gate capping pattern.

The first gate capping pattern may comprise SiN, and the second gate capping pattern may comprise SiCN.

The gate capping structure may comprise a first gate capping pattern and a second gate capping pattern sequentially stacked on the gate electrode, and the first gate capping pattern may comprise SiCN, and the second gate capping pattern may comprise SiN.

According to an example embodiment of the inventive concept, a method of fabricating a semiconductor device may include forming a sacrificial gate pattern on a substrate, replacing the sacrificial gate pattern with a preliminary gate electrode, recessing the preliminary gate electrode to form a gate electrode and a recessed region disposed above the gate electrode, forming a first gate capping layer to cover a top surface of the gate electrode and partially fill the recessed region, forming a second gate capping layer on the first gate capping layer, and planarizing the first and second gate capping layers to form a gate capping structure. The first gate capping layer may be formed using a deposition process capable of providing a better step coverage property than a deposition process for forming the second gate capping layer.

The method may further include forming spacer structures on both sidewalls of the sacrificial gate pattern, forming epitaxial patterns on the substrate at both sides of the sacrificial gate pattern, and forming a first interlayered dielectric layer to cover sidewalls of the spacer structures and expose top surfaces of the sacrificial gate pattern and the spacer structures. The recessed region may be formed to expose inner sidewalls of the spacer structures and the top surface of the gate electrode.

The method may further include forming a second interlayered dielectric layer on the first interlayered dielectric layer to cover the gate capping structure, and forming contact plugs to penetrate the second and first interlayered dielectric layers, the contact plugs being connected to the epitaxial patterns, respectively. At least a portion of the contact plug may be formed to be in contact with the gate capping structure.

The forming of the contact plugs may include forming contact holes penetrating the second and first interlayered dielectric layers. The gate capping structure may include a first gate capping pattern and a second gate capping pattern. The contact holes may be formed to expose a top surface of the first gate capping pattern.

The second gate capping layer may be formed using a deposition process capable of providing a better gapfill property than a deposition process for forming the first gate capping layer.

The forming of the first gate capping layer is performed using an atomic layer deposition process, and the forming of the second gate capping layer is performed using a plasma-enhanced chemical vapor deposition process or a high-density plasma chemical vapor deposition process.

The method may further include patterning the substrate to form an active fin. The sacrificial gate pattern may be formed to cross the active fin.

The forming of the active fin may include patterning the substrate to form device isolation trenches, forming a device isolation layer to fill the device isolation trenches, and recessing a top surface of the device isolation layer to form device isolation patterns, whose top surfaces are lower than that of the substrate.

The method may further include forming spacer structures on both sidewalls of the sacrificial gate pattern and forming epitaxial patterns at both sides of the sacrificial gate pattern using the spacer structures as a mask.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
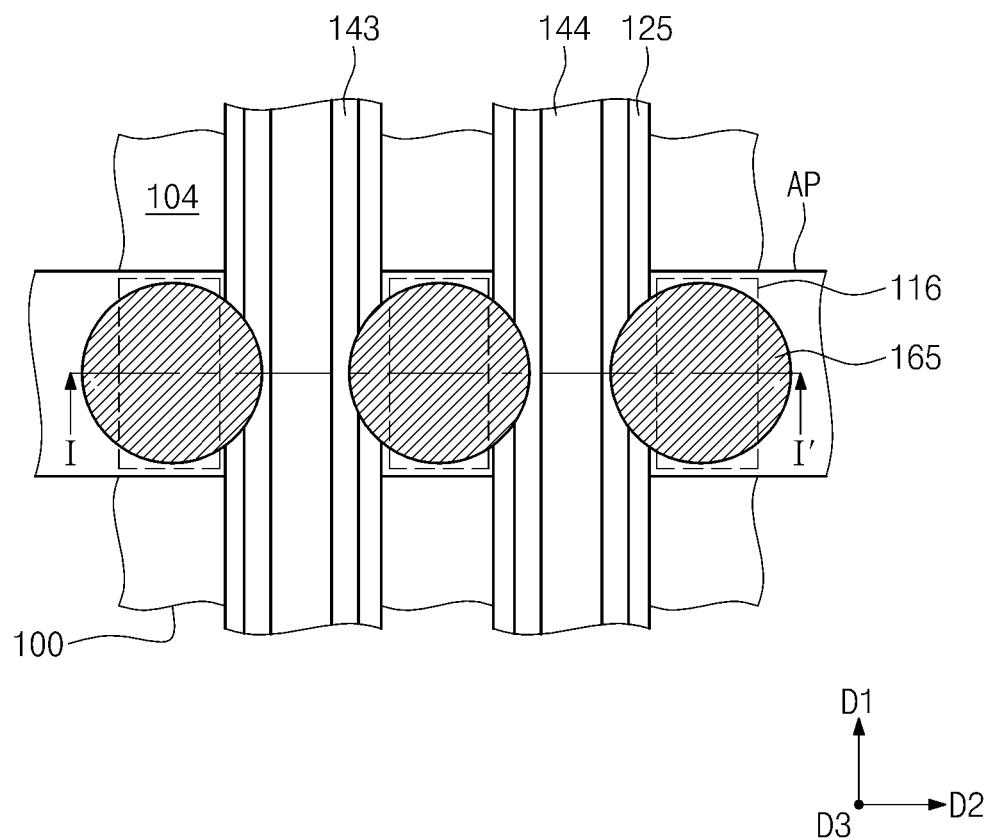
FIG. 1 is a plan view illustrating a semiconductor device, according to an example embodiment.

It should be noted that these drawings are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings. Example embodiments of the inventive concepts may, however, be embodied in many different forms and should not be construed as being limited to the embodiments set forth herein; rather, these embodiments are provided so that this disclosure will be thorough and complete, and will fully convey the inventive concept to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Example Embodiments]

Figure 2:
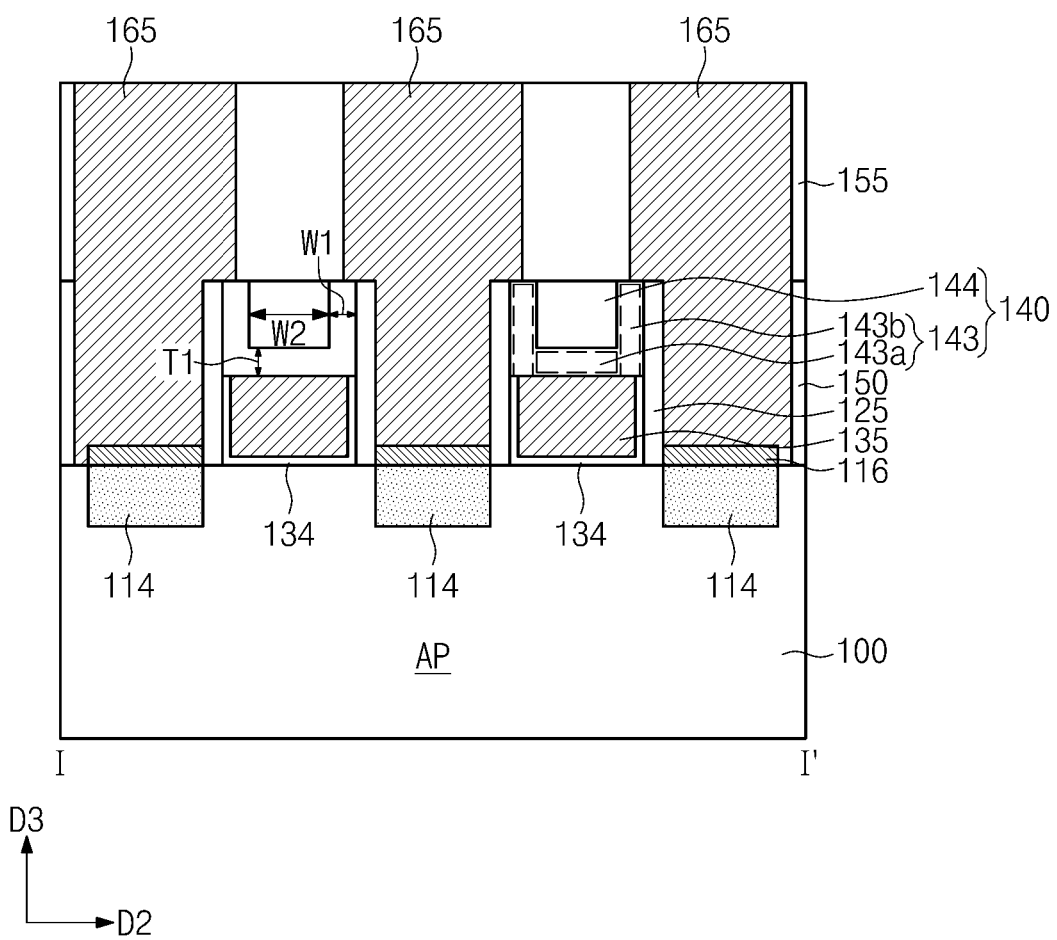
FIG. 2 is a sectional view taken along line I-I' of FIG. 1 to illustrate a semiconductor device, according to an example embodiment.

FIG. 1 is a plan view illustrating a semiconductor device according to an example embodiment. FIG. 2 is a sectional view taken along line I-I' of FIG. 1 to illustrate a semiconductor device according to an example embodiment.

Referring to FIGS. 1 and 2, a substrate 100 may be or include a semiconductor substrate, which is made of at least one of silicon, germanium, silicon-germanium, or semiconductor compound. A device isolation pattern 104 may be provided in the substrate 100 to define an active pattern AP. The device isolation pattern 104 may be formed of or include an insulating material (e.g., silicon oxide). The active pattern AP may be a portion of the substrate 100 delimited by the device isolation pattern 104. The active pattern AP may extend parallel to a top surface of the substrate 100 (for example, along a second direction D2) and may be shaped like a line or bar. Although one active pattern AP is illustrated, the substrate 100 may have a plurality of active patterns AP. In this case, the active patterns AP may be arranged along a first direction D1 crossing the second direction D2. The active pattern AP may have a first conductivity type.

Gate electrodes 135 may be provided on the substrate 100. According to an example embodiment, the gate electrodes 135 may be formed of or include a metallic material. For example, the gate electrodes 135 may be formed of or include at least one of metal nitrides (e.g., titanium nitride or tantalum nitride) and metals (e.g., titanium, tantalum, tungsten, copper, or aluminum).

Each of the gate electrodes 135 may be a line- or bar-shaped structure crossing the active pattern AP and extending parallel to the first direction D1. A plurality of gate electrodes 135 may be provided to cross at least one of the active patterns AP. As an example, a pair of the gate electrodes 135 may be provided spaced apart from each other in the second direction D2 and may extend parallel to the first direction D1 on an active pattern AP. For the sake of simplicity, the description that follows will refer to an example in which a pair of the gate electrodes 135 are provided spaced apart from each other in the second direction D2 to cross the active pattern AP.

Spacer structures 125 may be provided on both sidewalls of each of the gate electrodes 135. The spacer structures 125 may extend along the gate electrodes 135 or parallel to the first direction D1. Each of the spacer structures 125 may have a top surface that is positioned at a higher level than those of the gate electrodes 135. Further, the top surface of each of the spacer structures 125 may be coplanar with that of a first interlayered dielectric (ILD) layer 150, which will be described below. The spacer structures 125 may be formed of or include at least one of $SiO_2$, SiCN, SiCON, or SiN. Alternatively, each of the spacer structures 125 may be a multi-layered structure including at least one of $SiO_2$, SiCN, SiCON, or SiN.

Gate dielectric layers 134 may be provided between the gate electrodes 135 and the substrate 100, and between the gate electrodes 135 and the spacer structures 125. The gate dielectric layers 134 may be formed of or include, for example, a high-k material. As an example, the gate dielectric layers 134 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Gate capping structures 140 may be disposed on the gate electrodes 135, respectively. The gate capping structures 140 may extend along the gate electrodes 135 or parallel to the first direction D1. Each of the gate capping structures 140 may include a first gate capping pattern 143 and a second gate capping pattern 144, which are sequentially stacked on the gate electrode 135.

The first gate capping pattern 143 may include a horizontally-extended portion 143a, which extend along a top surface of the gate electrode 135 or parallel to the first direction D1, and vertically-extended portions 143b, which are provided on both sides of the horizontally-extended portion 143a. The horizontally-extended portion 143a may be provided to cover the gate electrode 135 and may have a width smaller than the gate electrode 135, when measured in the second direction D2. The vertically-extended portions 143b may extend upward from the top surface of the gate electrode 135 or along a third direction D3. Here, the third direction D3 may be orthogonal to both the first and second directions D1 and D2 (for example, normal to the top surface of the substrate 100). The horizontally-extended portion 143a may be provided between the vertically-extended portions 143b. The first gate capping pattern 143 may be formed using a deposition process with a good step coverage property (e.g., an atomic layer deposition (ALD) process). Accordingly, the first gate capping pattern 143 can be formed to have a dense and conformal structure. According to an example embodiment, the horizontally-extended portion 143a may have a thickness T1 that is substantially equal to a width W1 of each of the vertically-extended portions 143b.

The second gate capping pattern 144 may extend along the gate electrode 135 or parallel to the first direction D1. A bottom surface of the second gate capping pattern 144 may be in contact with a top surface of the horizontally-extended portion 143a, and both sidewalls of the second gate capping pattern 144 may be in contact with the vertically-extended portions 143b, respectively. In other words, each of the vertically-extended portions 143b may be interposed between the spacer structures 125 and the second gate capping pattern 144. Further, the bottom surface of the second gate capping pattern 144 may be in contact with the top surface of the horizontally-extended portion 143a at a level that is positioned between top surfaces of the gate electrode 135 and the first ILD layer 150. A top surface of the second gate capping pattern 144 may be coplanar with top surfaces of the vertically-extended portions 143b, the spacer structures 125, and the first ILD layer 150. The second gate capping pattern 144 may be formed to have a width W2, which is greater than two times the width W1 of each of the vertically-extended portions 143b.

The second gate capping pattern 144 may be formed by a deposition process having a good gapfill property (e.g., a chemical vapor deposition (CVD) process). For example, the second gate capping pattern 144 may be formed using one of plasma-enhanced chemical vapor deposition (PE-CVD) and high density plasma chemical vapor deposition (HDP CVD) processes. When compared with the deposition process for the first gate capping pattern 143, the second gate capping pattern 144 may be formed by a deposition process with a better gapfill property but a worse step coverage property, and in this case, the second gate capping pattern 144 may be formed to have a density lower than the first gate capping pattern 143, or may be formed of a material having a lower density than a material of the first gate capping pattern 143.

The gate capping structures 140 may be formed of or include a material having an etch selectivity with respect to first and second ILD layers 150 and 155, which will be described below. For example, each of the first and second gate capping patterns 143 and 144 may be formed of or include at least one of SiON, SiCN, SiCON or SiN.

In general, an etch rate of a material decreases as a dielectric constant thereof increases. According to an example embodiment, the presence of the first gate capping pattern 143 may prevent the gate electrode 135 from being damaged in a subsequent process for forming contact plugs 165. For example, the first gate capping pattern 143 may be formed to have a dielectric constant higher than that of the second gate capping pattern 144. As an example, the first gate capping pattern 143 may include SiN, whereas the second gate capping pattern 144 may include SiCN. In the case where the second gate capping pattern 144 is formed of a low-k material (e.g., SiCN), it is possible to improve a resistor-capacitor (RC)-delay property of the semiconductor device.

In another example embodiment, the second gate capping pattern 144 may be formed to have a dielectric constant higher than that of the first gate capping pattern 143. The first capping pattern 143 having a relatively low dielectric constant may be directly adjacent to the gate electrode 135, thereby decreasing a parasitic capacitance between the gate electrode 135 and the gate capping structure 140. That leads to improving a resistor-capacitor (RC)-delay property of the semiconductor device. As an example, the first gate capping pattern 143 may include SiCN, whereas the second gate capping pattern 144 may include SiN.

In the deposition process for forming the second gate capping pattern 144, an etching gas containing fluorine (F) may be additionally used to improve a gapfill property of the deposition layer. In this case, the fluorine (F) may be contained in the second gate capping pattern 144. According to an example embodiment, the first gate capping pattern 143 may be used as a barrier layer for preventing the fluorine (F) contained in the second gate capping pattern 144 from being diffused to the gate electrode 135. Nevertheless, the first gate capping pattern 143 may contain a small amount of fluorine F, owing to the diffusion of the fluorine. However, the fluorine concentration may be higher in the second gate capping pattern 144 than in the first gate capping pattern 143.

According to an example embodiment, the first gate capping pattern 143 may be formed of at least one of materials with high dielectric constant and high density, and thus, it is possible to effectively protect top portions of the gate electrodes 135 against an etch damage, which may occur in an etching process for forming the contact plugs 165. Further, by virtue of the presence of the first gate capping pattern 143, it is possible to suppress the diffusion of fluorine from the second gate capping pattern 144 to the gate electrode 135, and this makes it prevent a threshold voltage of a transistor from being changed by the fluorine. In other words, since the first and second gate capping patterns 143 and 144 are formed by different deposition processes or of different materials, they can have different properties from each other. This makes it possible to form the contact plugs 165 in a self-aligned manner, without any short circuit between the contact plugs 165 and the gate electrodes 135, and to improve operation speed and characteristics of the semiconductor device.

The structure of the gate capping structures 140 may not be limited to the afore-described structure having the first and second gate capping patterns 143 and 144. For example, each of the gate capping structures 140 may be configured to include at least three layers provided on the gate electrode.

Epitaxial patterns 114 may be provided to be in contact with the active pattern AP between the gate electrodes 135. The epitaxial patterns 114 may serve as source and/or drain regions of a field effect transistor. Top surfaces of the epitaxial patterns 114 may be positioned at a level that is equivalent to or higher than that of the active pattern AP. According to an example embodiment, as shown, the epitaxial patterns 114 may have a flat top surface, but according to another example embodiment, the epitaxial patterns 114 may be provided to have a curved top surface with a finite curvature. As an example, the epitaxial patterns 114 may be formed to have upward convex top surfaces. Although not shown, bottom surfaces of the epitaxial patterns 114 may be positioned above the bottom surface of the device isolation pattern 104.

The epitaxial patterns 114 may be formed of or include a semiconductor material different from the substrate 100. For example, the epitaxial patterns 114 may be formed of or include a semiconductor material having a lattice constant different from (for example, greater or smaller than) the substrate 100. Accordingly, the epitaxial patterns 114 may exert a compressive or tensile stress on a channel region, which is a portion of the active pattern AP positioned below the gate electrodes 135. As an example, the substrate 100 may be a silicon wafer, and the epitaxial patterns 114 may be formed of or include embedded silicon-germanium (e-SiGe) or germanium. In this case, a compressive stress may be exerted on the channel region, and the epitaxial patterns 114 may constitute p-type metal-oxide-semiconductor (PMOS) field effect transistors. According to another example embodiment, the substrate 100 may be a silicon wafer, and the epitaxial patterns 114 may be formed of or include silicon carbide (SiC). In this case, a tensile force may be exerted on a channel region, and the epitaxial patterns 114 may constitute n-type metal-oxide-semiconductor (NMOS) field effect transistors. The compressive or tensile stress exerted on the channel region may make it possible to increase mobility of carriers in the channel region, when the field effect transistors are operated. The epitaxial patterns 114 may have a second conductivity type that is different from that of the active pattern AP of the first conductive type.

Semiconductor capping patterns 116 may be provided on the epitaxial patterns 114, respectively. The semiconductor capping patterns 116 may include the same semiconductor element as the substrate 100 or the epitaxial patterns 114. As an example, the semiconductor capping patterns 116 may be formed of or include silicon or silicon-germanium. According to an example embodiment, each of the semiconductor capping patterns 116 may be a double-layered structure including a silicon layer and a silicon-germanium layer. According to another example embodiment, the semiconductor capping patterns 116 may be doped with elements different from dopants contained in the epitaxial patterns 114. For example, in the case where the epitaxial patterns 114 contains an e-SiGe layer, the semiconductor capping patterns 116 may be formed of or include a lightly Ge-doped layer and/or a highly B-doped layer. This makes it possible to reduce contact resistance between the semiconductor capping patterns 116 and the epitaxial patterns 114.

Although not shown, a metal silicide layer may be further provided on the semiconductor capping patterns 116. The metal silicide layer may be formed by chemical reaction between semiconductor and metallic elements contained in the semiconductor capping patterns 116.

The first ILD layer 150 may be provided on the substrate 100. The first ILD layer 150 may have the top surface that is substantially coplanar with those of the spacer structures 125 and the gate capping structures 140. The first ILD layer 150 may include a silicon oxide layer. The second ILD layer 155 may be formed on the first ILD layer 150 to cover the gate capping structures 140. The second ILD layer 155 may be formed of or include a silicon oxide layer or a low-k oxide layer. For example, the low-k oxide layer for the second ILD layer 155 may include a carbon-doped silicon oxide layer (e.g., SiCOH). Although not shown, a pad oxide (not shown) may be further disposed between the substrate 100 and the first ILD layer 150. The pad oxide may be formed of, for example, a silicon oxide layer.

The contact plugs 165 may be provided on the substrate 100 to penetrate the first and second ILD layers 150 and 155, and be in contact with the semiconductor capping patterns 116, respectively. At least one of the contact plugs 165 may be in direct contact with at least one of the first gate capping patterns 143. Further, at least one of the contact plugs 165 may be in direct contact with at least one of the spacer structures 125. Due to the presence of the first gate capping patterns 143 and the spacer structures 125, the contact plugs 165 may be electrically and spatially separate from the gate electrode 135.

Referring back to FIG. 1, when viewed in a plan view, each of the contact plugs 165 may be aligned with a corresponding one of the semiconductor capping patterns 116 or the epitaxial patterns 114. The contact plug 165 may include a portion that is not overlapped with the semiconductor capping pattern 116 or the epitaxial pattern 114, in the plan view. For example, at least one of the contact plugs 165 may be overlapped with at least one of the spacer structures 125 and/or at least one of the first gate capping patterns 143, in the plan view. However, the contact plugs 165 may not be overlapped with the second gate capping patterns 144. In other words, the width W1 of the vertically-extended portion 143b may be long enough to prevent the contact plugs 165 from being overlapped with the second gate capping patterns 144, when viewed in the plan view.

Due to the presence of the spacer structures 125 and the first gate capping patterns 143, the contact plugs 165 may be connected to the epitaxial patterns 114 and be disposed spaced apart from the gate electrodes 135. The contact plugs 165 may include a metallic material (e.g., tungsten). According to an example embodiment, each of the contact plugs 165 may be a double-layered structure including a barrier metal layer (e.g., of a metal nitride) and a metal layer (e.g., of tungsten).

According to an example embodiment, the semiconductor device may include a field effect transistor with the gate electrode 135 and the gate capping structure 140 stacked thereon. Here, the gate capping structure 140 may be configured to protect a top portion of the gate electrode 135 from an etching process for forming a contact hole. For example, the gate capping structure 140 may include the first gate capping pattern 143 having a high etch selectivity with respect to the first and second ILD layers 150 and 155, and this makes it possible to effectively protect the gate electrodes 135 against etch damage, which may occur in the etching process for forming the contact hole. Further, this makes it possible to enlarge a process margin in the contact-hole etching process. Accordingly, it is possible to provide a semiconductor device with improved electric characteristics and a method of fabricating the same with an enlarged process margin.

FIGS. 3A through 3L are sectional views illustrating a method of fabricating a semiconductor device according to an example embodiment. In detail, each of FIG. 3A through 3L is a sectional view taken along line I-I' of FIG. 1.

Figure 3A:
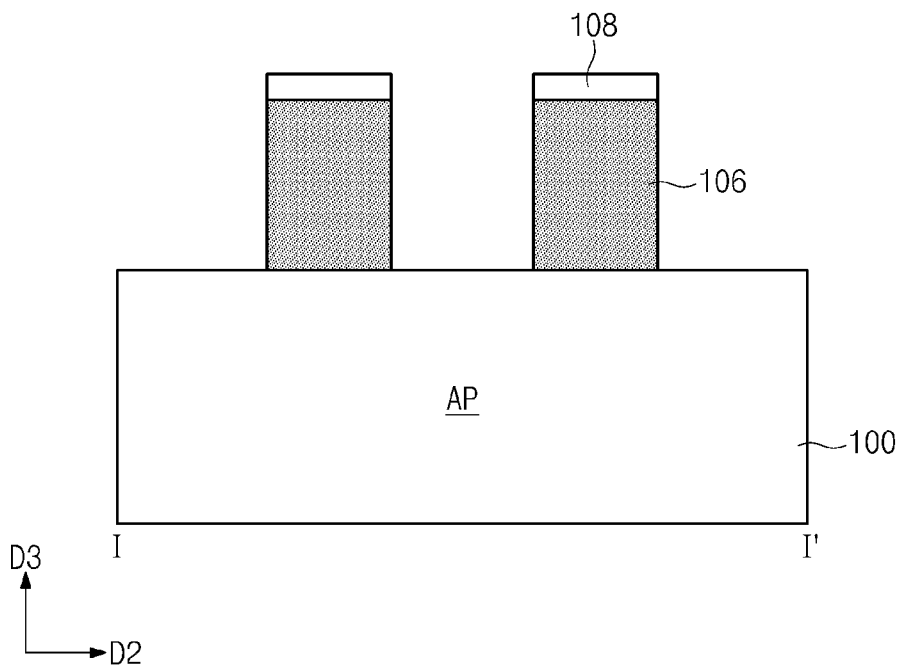
FIGS. 3A through 3L are sectional views illustrating a method of fabricating a semiconductor device, according to example embodiments.

Referring to FIGS. 1 and 3A, sacrificial gate patterns 106 and gate mask patterns 108 may be sequentially formed on the substrate 100.

The substrate 100 may be or include a semiconductor substrate, which is made of at least one of silicon, germanium, silicon-germanium, or semiconductor compound. The device isolation pattern 104 may be formed in the substrate 100 to define the active pattern AP. The device isolation pattern 104 may be formed using a shallow trench isolation (STI) process. For example, the formation of the device isolation pattern 104 may include patterning the substrate 100 to form a trench (not shown) and filling the trench with an insulating layer (e.g., of silicon oxide).

The active pattern AP may be a portion of the substrate 100 delimited by the device isolation pattern 104. The active pattern AP may extend parallel to the top surface of the substrate 100 or along the second direction D2, and may be shaped like a line or bar. Although one active pattern AP is illustrated, the substrate 100 may have a plurality of active patterns AP. In this case, the active patterns AP may be arranged along the first direction D1 or to cross the second direction D2. The active pattern AP may be doped to have the first conductivity type.

Each of the sacrificial gate patterns 106 and the gate mask patterns 108 may be a line- or bar-shaped structure crossing the active pattern AP and extending parallel to the first direction D1. For example, the sacrificial gate patterns 106 and the gate mask patterns 108 may be formed by sequentially forming a sacrificial gate layer (not shown) and a gate mask layer (not shown) on the substrate 100, and patterning the sacrificial gate layer and the gate mask layer.

The sacrificial gate patterns 106 may be formed to cross at least one of the active patterns AP. As an example, a pair of the sacrificial gate patterns 106 may be formed spaced apart from each other in the second direction D2, and may extend parallel to the first direction D1 on the active pattern AP. The sacrificial gate layer may be formed of or include a poly-silicon layer. The gate mask layer may be formed of or include a silicon nitride layer or a silicon oxynitride layer.

Although not shown, a pad oxide (not shown) may be formed on the substrate 100, before the formation of the sacrificial gate layer. The pad oxide (not shown) may be formed using a dry oxidation process, a wet oxidation process, or a radical oxidation process. For the sake of simplicity, the description that follows will refer to an example in which a pair of sacrificial gate patterns 106 are formed spaced apart from each other in the second direction D2 to cross one of the active patterns AP.

Figure 3B:
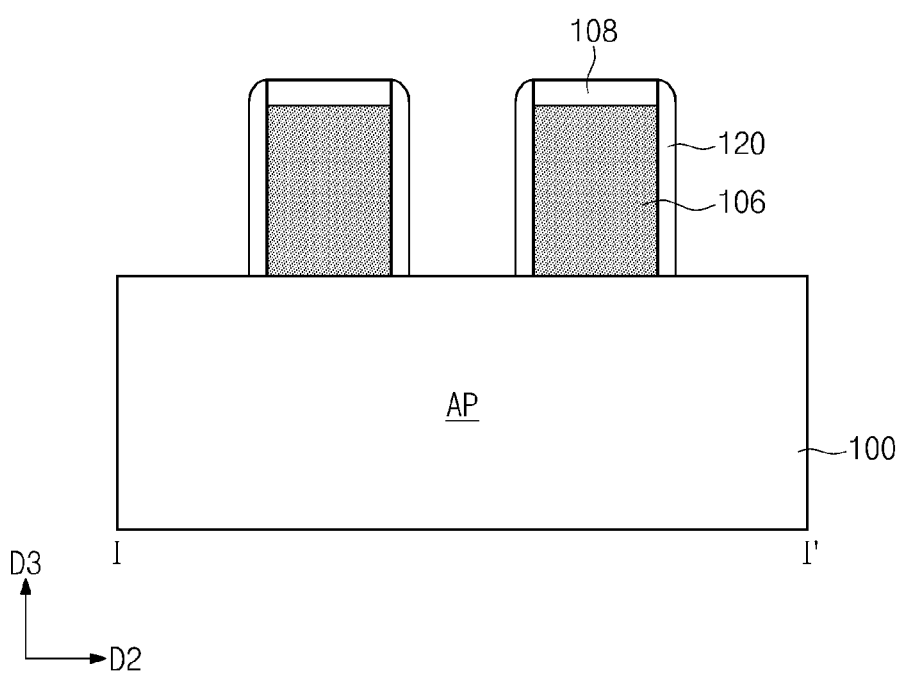

Referring to FIGS. 1 and 3B, spacers 120 may be formed on both sidewalls of the sacrificial gate patterns 106. The formation of the spacers 120 may be performed by conformally forming a spacer layer on the substrate 100 provided with the sacrificial gate patterns 106, and then, performing an anisotropic etching process on the spacer layer. The spacers 120 may extend along the sacrificial gate patterns 106 or parallel to the first direction D1. The spacer layer may be formed of or include at least one of $SiO_2$, SiCN, SiCON, or SiN. Alternatively, the spacer layer may be a multi-layered structure including at least one of $SiO_2$, SiCN, SiCON, or SiN.

Figure 3C:
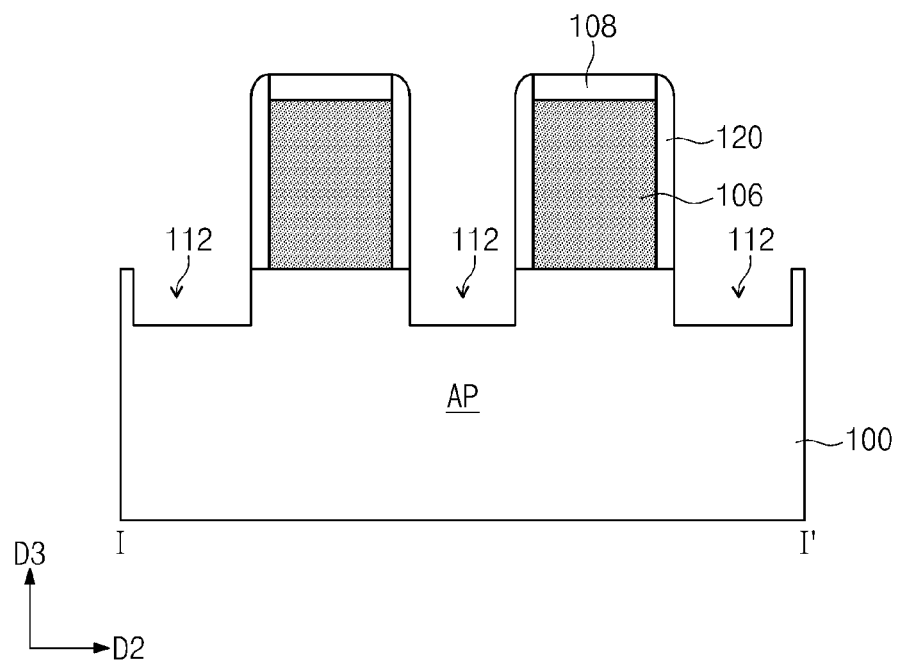

Referring to FIGS. 1 and 3C, first recessed regions 112 may be formed in the active pattern AP. The first recessed regions 112 may be formed by selectively etching the active pattern AP using the gate mask patterns 108 and the spacers 120 as an etch mask. As a result, the first recessed regions 112 may be formed between the sacrificial gate patterns 106 and formed at both sides of a pair of the sacrificial gate patterns 106 on the active pattern AP. Although not shown, the first recessed regions 112 may be formed to have bottom surfaces positioned at a higher level than that of the device isolation pattern 104. According to an example embodiment, the selective etching of the active pattern AP may be performed by anisotropically etching the active pattern AP. According to another example embodiment, the selective etching of the active pattern AP may be isotropically performed using a wet etching process, and in this case, unlike the shown example, the first recessed regions 112 may extend below the sacrificial gate patterns 106.

Figure 3D:
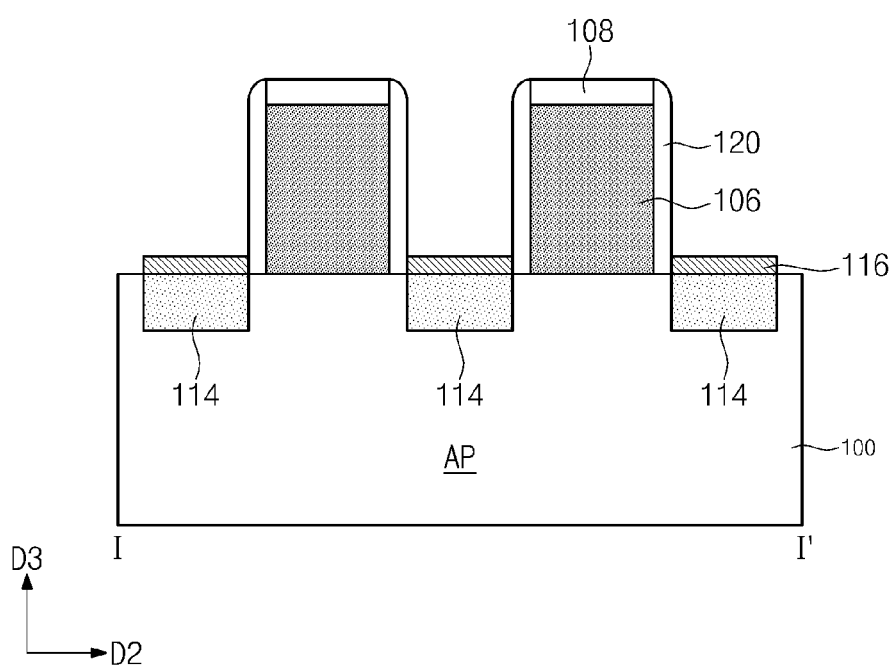

Referring to FIGS. 1 and 3D, the epitaxial patterns 114 may be formed in the first recessed regions 112, respectively. The epitaxial patterns 114 may be used as source and/or drain regions of a field effect transistor according to an example embodiment.

The epitaxial patterns 114 may be formed by a selective epitaxial growth process using the substrate 100 as a seed layer. The selective epitaxial growth process may include, for example, a chemical vapor deposition (CVD) process or a molecular beam epitaxy (MBE) process. Each of the epitaxial patterns 114 may be formed to entirely fill a corresponding one of the recess regions 112. According to an example embodiment, as shown, the epitaxial pattern 114 may be formed to have a top surface coplanar with that of the active pattern AP, but according to another example embodiment, the epitaxial patterns 114 may be formed to have a top surface positioned at a higher level than that of the active pattern AP. Further, unlike the shown example, the epitaxial patterns 114 may be provided to have a curved top surface with a finite curvature. As an example, the epitaxial patterns 114 may be formed to have upward convex top surfaces.

The epitaxial patterns 114 may be formed of or include a semiconductor material different from the substrate 100. For example, the epitaxial patterns 114 may be formed of or include a semiconductor material having a lattice constant different from (for example, greater or smaller than) the substrate 100. Accordingly, the epitaxial patterns 114 may exert a compressive or tensile stress on a channel region, which is a portion of the active pattern AP positioned below the sacrificial gate patterns 106. As an example, the substrate 100 may be a silicon wafer, and the epitaxial patterns 114 may be formed of or include embedded silicon-germanium (e-SiGe) or germanium. In this case, a compressive stress may be exerted on the channel region, and the epitaxial patterns 114 may constitute PMOS field effect transistors. As another example, the substrate 100 may be a silicon wafer, and the epitaxial patterns 114 may be formed of or include silicon carbide (SiC). In this case, a tensile stress may be exerted on the channel region, and the epitaxial patterns 114 may constitute NMOS field effect transistors. The compressive or tensile stress exerted on the channel region may make it possible to increase mobility of carriers in the channel region, when the field effect transistors are operated.

The epitaxial patterns 114 may be doped to have a different conductivity type from that of the active pattern AP or have the second conductivity type. According to an example embodiment, the doping of the epitaxial patterns 114 may be performed in an in-situ manner, when the epitaxial patterns 114 are formed. According to another example embodiment, the doping of the epitaxial patterns 114 may be performed using an ion implantation process, after the formation of the epitaxial patterns 114.

Thereafter, the semiconductor capping patterns 116 may be formed on top surfaces of the epitaxial patterns 114, respectively. The semiconductor capping patterns 116 may be formed of or include the same semiconductor element as the substrate 100 or the epitaxial patterns 114. For example, the semiconductor capping patterns 116 may be formed of or include silicon or silicon-germanium. Alternatively, each of the semiconductor capping patterns 116 may be a double-layered structure including a silicon layer and a silicon-germanium layer. According to an example embodiment, the semiconductor capping patterns 116 may be doped with elements different from dopants contained in the epitaxial patterns 114. For example, in the case where the epitaxial patterns 114 is formed of an e-SiGe layer, the semiconductor capping patterns 116 may be formed of a lightly Ge-doped layer and/or a highly B-doped layer. The B-doped layer may be formed by an ion implantation, plasma doping, or in-situ doping process. This makes it possible to reduce contact resistance between the semiconductor capping patterns 116 and the source and/or drain regions.

Although not shown, a metal silicide layer may be additionally formed on the semiconductor capping patterns 116. The metal silicide layer may be formed by chemical reaction between semiconductor and metallic elements contained in the semiconductor capping patterns 116.

Figure 3E:
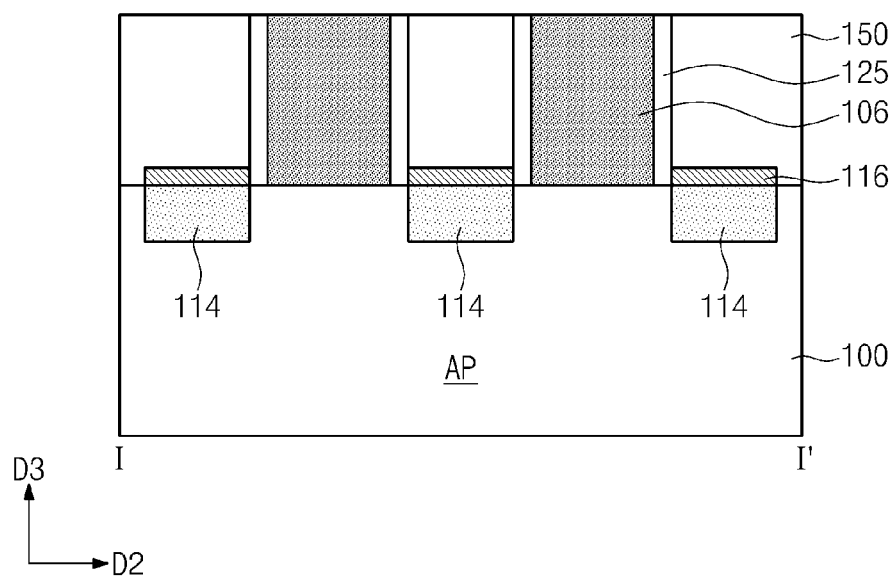

Referring to FIGS. 1 and 3E, the first ILD layer 150 may be formed on the structure provided with the semiconductor capping patterns 116. The formation of the first ILD layer 150 may be performed by forming an insulating layer to cover the structure provided with the sacrificial gate patterns 106 and the gate mask patterns 108, and then, planarizing the insulating layer to expose top surfaces of the sacrificial gate patterns 106.

The first ILD layer 150 may include a silicon oxide layer, which may be formed by, for example, a flowable chemical vapor deposition (FCVD) process. The planarization of the first ILD layer 150 may be performed using an etch-back or chemical mechanical polishing (CMP) process. As a result of the planarization process, the gate mask patterns 108 may be removed to expose the top surfaces of the sacrificial gate patterns 106. Further, the planarization process may be performed to remove upper portions of the spacers 120, and thus, the spacer structures 125 may be formed on both sidewalls of each of the sacrificial gate patterns 106. In other words, after the planarization process, the first ILD layer 150 may have a top surface coplanar with the top surfaces of the sacrificial gate patterns 106 and the spacer structures 125.

Figure 3F:
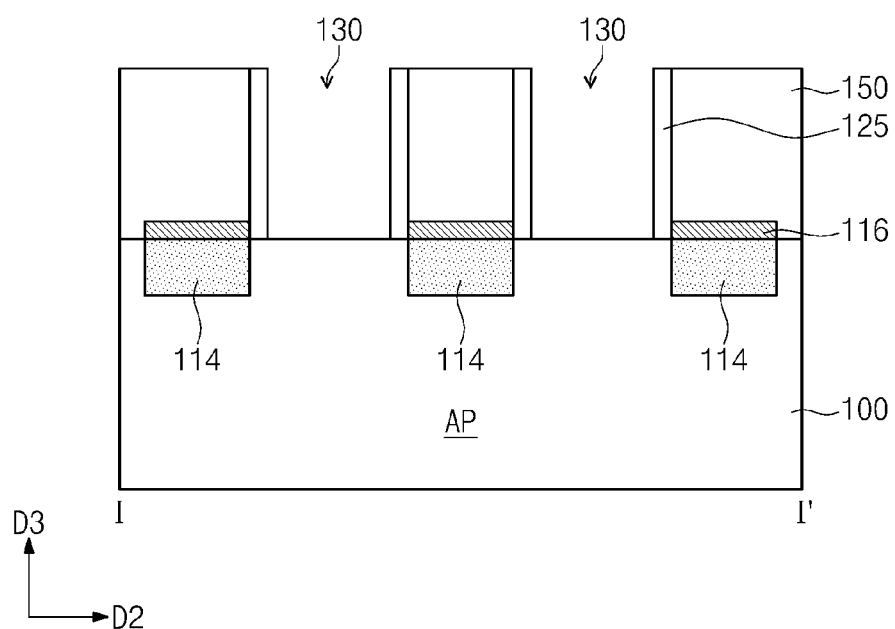

Referring to FIGS. 1 and 3F, the sacrificial gate patterns 106 may be removed to form gate trenches 130. The gate trenches 130 may be formed by selectively etching the sacrificial gate patterns 106. The gate trenches 130 may be formed to expose the top surface of the substrate 100 and extend parallel to the first direction D1.

Figure 3G:
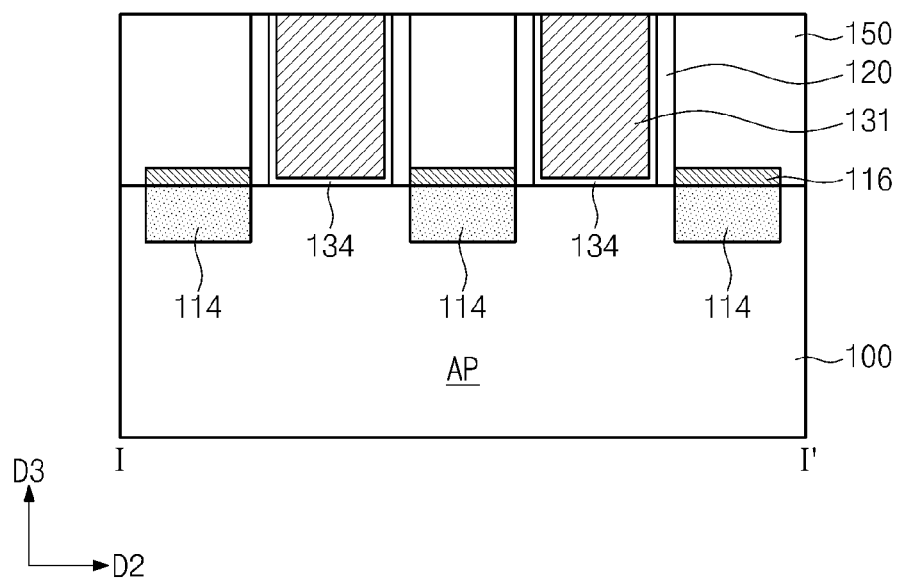

Referring to FIGS. 1 and 3G, the gate dielectric layer 134 and a preliminary gate electrode 131 may be formed in each of the gate trenches 130. For example, the gate dielectric layer 134 may be formed to entirely cover the structure provided with the gate trenches 130. The gate dielectric layer 134 may be conformally formed to have a thickness that is too small to completely fill the gate trenches 130. In other words, the gate dielectric layer 134 may be formed to cover bottom surfaces of the gate trenches 130, sidewalls of the spacers 120 exposed by the gate trenches 130, and the top surface of the first ILD layer 150. The gate dielectric layer 134 may be formed by an ALD process or a chemical oxidation process. According to an example embodiment, the gate dielectric layer 134 may include a high-k material. For example, the gate dielectric layer 134 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Thereafter, a gate electrode layer (not shown) may be formed to fill the gate trenches 130 provided with the gate dielectric layer 134, and then, the gate electrode layer and the gate dielectric layer 134 may be planarized to expose the top surface of the first ILD layer 150. Accordingly, the gate dielectric layer 134 and the preliminary gate electrode 131 may be locally formed in each of the gate trenches 130. The gate dielectric layer 134 and the preliminary gate electrode 131 may extend parallel to the first direction D1. According to an example embodiment, the gate electrode layer may be formed of or include at least one of conductive metal nitrides (e.g., titanium nitride or tantalum nitride) or metals (e.g., titanium, tantalum, tungsten, copper, or aluminum). The gate electrode layer may be formed by a deposition process (e.g., a CVD or sputtering process). The planarization of the gate electrode layer and the gate dielectric layer 134 may include a CMP process. As a result of the planarization process, the first ILD layer 150 may have a top surface coplanar with top surfaces of the preliminary gate electrodes 131 and the spacer structures 125.

Figure 3H:
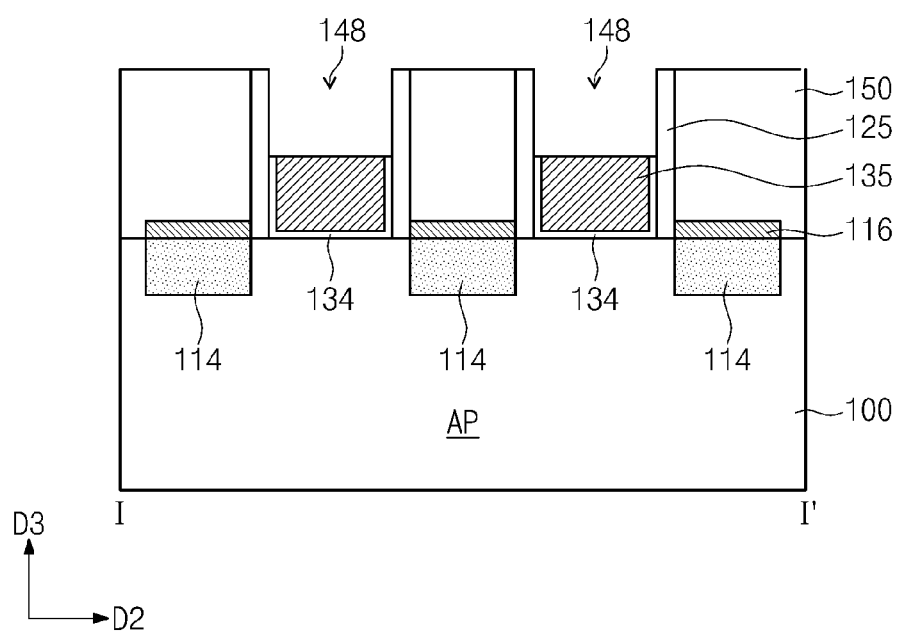

Referring to FIGS. 1 and 3H, the preliminary gate electrodes 131 may be downward recessed to form the gate electrodes 135 and define second recessed regions 148. For example, the gate electrodes 135 may be formed by selectively etching upper portions of the preliminary gate electrodes 131. The etching process may be performed in such a way that top surfaces of the gate electrodes 135 are positioned at a lower level than that of the first ILD layer 150. According to an example embodiment, after the formation of the gate electrodes 135, portions of the gate dielectric layer 134 exposed by the gate electrodes 135 may be removed. Accordingly, the gate dielectric layer 134 may be locally formed between the gate electrodes 135 and the substrate 100 and between the gate electrodes 135 and the spacer structures 125. In other words, the second recessed regions 148 may be formed to expose the top surfaces of the gate electrodes 135 and the gate dielectric layer 134 and inner sidewalls of the spacer structures 125.

Figure 3I:
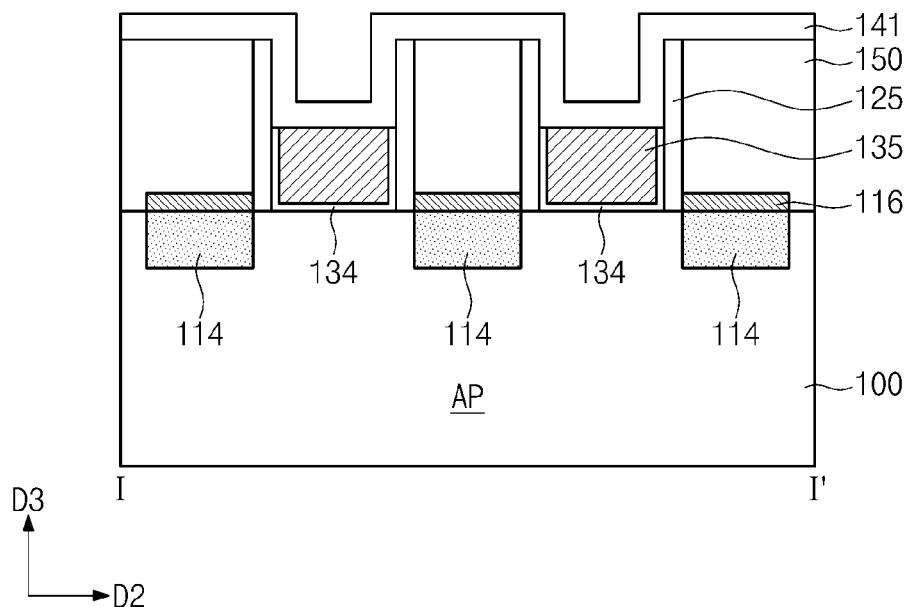

Referring to FIGS. 1 and 3I, a first gate capping layer 141 may be formed to cover the top surfaces of the gate electrodes 135. The first gate capping layer 141 may be conformally formed to have a thickness that is too small to completely fill the second recessed regions 148 and to cover the top surface of the first ILD layer 150. The first gate capping layer 141 may be formed of or include a material having an etch selectivity with respect to not only the first ILD layer 150 but also the second ILD layer 155, which will be formed in a subsequent process. According to an example embodiment, the first gate capping layer 141 may be formed of or include at least one of SiON, SiCN, SiCON, or SiN.

The first gate capping layer 141 may be formed using, for example, a deposition process with a good step coverage property (e.g., an ALD process). The use of the ALD process may make it possible to conformally form the first gate capping layer 141; for example, on the top surface of the gate electrode 135, the top surface of the gate dielectric layer 134, the inner sidewall of the spacer structure 125, and the top surface of the first ILD layer 150, the first gate capping layer 141 can be formed to the same thickness. The first gate capping layer 141 may be formed sufficiently thick. For example, as will be described below, the first gate capping layer 141 may be thick enough to allow contact holes 160 to expose the first gate capping patterns 143 except the second gate capping patterns 144.

Figure 3J:
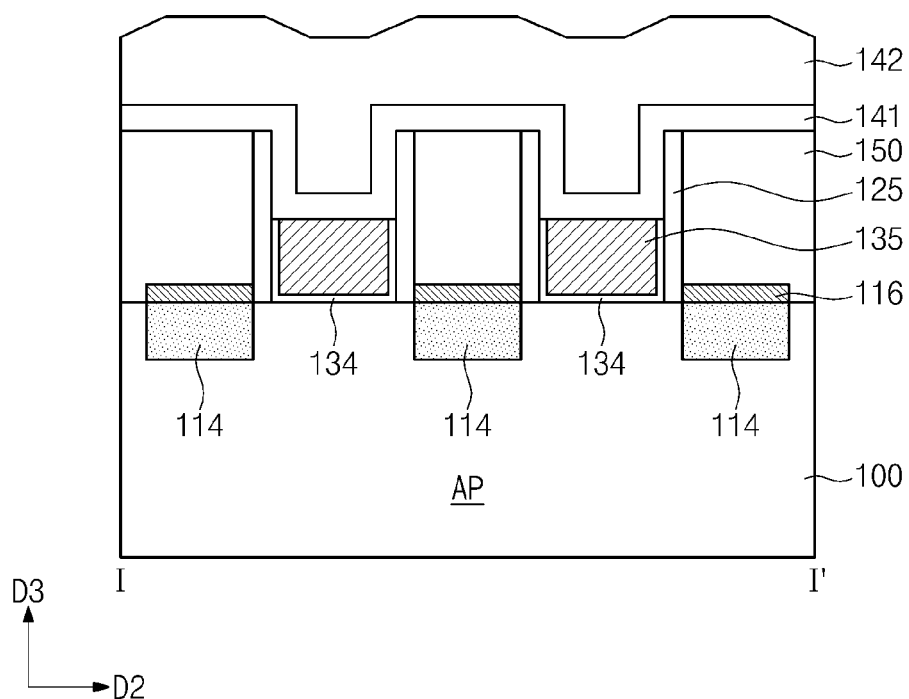

Referring to FIGS. 1 and 3J, a second gate capping layer 142 may be formed on the first gate capping layer 141. The second gate capping layer 142 may be formed on the whole top surface of the substrate 100, thereby covering the whole top surface of the first gate capping layer 141. The second gate capping layer 142 may be formed of or include a material having an etch selectivity with respect to not only the first ILD layer 150 but also the second ILD layer 155, which will be formed in a subsequent process. As an example, the second gate capping layer 142 may be formed of or include at least one of SiON, SiCN, SiCON, or SiN. According to an example embodiment, the second gate capping layer 142 may be formed of the same material as the first gate capping layer 141, and in other embodiments, they may be formed of different materials. In certain embodiments, as described above, in order to increase an etch selectivity, the first gate capping layer 141 may be formed of or include a material (e.g., SiN), whose dielectric constant is higher than that of the second gate capping layer 142. Further, to improve an RC-delay property of the semiconductor device, the second gate capping layer 142 may be formed of or include a material (e.g., SiCN) with a low dielectric constant.

In another example embodiment, the second gate capping layer 142 may be formed of a material, whose dielectric constant is higher than that of the first gate capping layer 141. In the case where the first gate capping layer 141 may be formed of SiCN and the second gate capping layer 142 may be formed of SiN, it is possible to improve an RC-delay property of the semiconductor device.

According to an example embodiment, the second gate capping layer 142 may be formed by a deposition process having a good gapfill property (e.g., a chemical vapor deposition (CVD) process). For example, the second gate capping layer 142 may be formed using one of plasma-enhanced chemical vapor deposition (PE-CVD) and high density plasma chemical vapor deposition (HDP CVD) processes. When compared with the deposition process for the first gate capping layer 141, the second gate capping layer 142 may be formed by a deposition process with a better gapfill property but a worse step coverage property, and thus, the second gate capping layer 142 can be deposited at a higher deposition rate than the first gate capping layer 141. That is, there may be advantages in terms of process efficiency and electric characteristics, compared to the case that the gate capping layer is formed of a single layer (e.g., the first gate capping layer 141). A deposited thickness of the second gate capping layer 142 may be greater than two times a deposited thickness of the first gate capping layer 141.

In the deposition process for forming the second gate capping layer 142, an etching gas containing fluorine (F) may be additionally used to improve a gapfill property of the deposition layer. In this case, the fluorine (F) may be contained in the second gate capping pattern 144. A fluorine concentration may be lower in the first gate capping layer 141 than in the second gate capping layer 142. Accordingly, when compared to the case that the gate capping layer is formed of a single layer (e.g., the second gate capping layer 142), it is possible to suppress or prevent fluorine from being diffused into the gate electrodes 135 and effectively protect the gate electrodes 135 against an etch damage, which may occur in a subsequent etching process for forming the contact plugs 165.

Figure 3K:
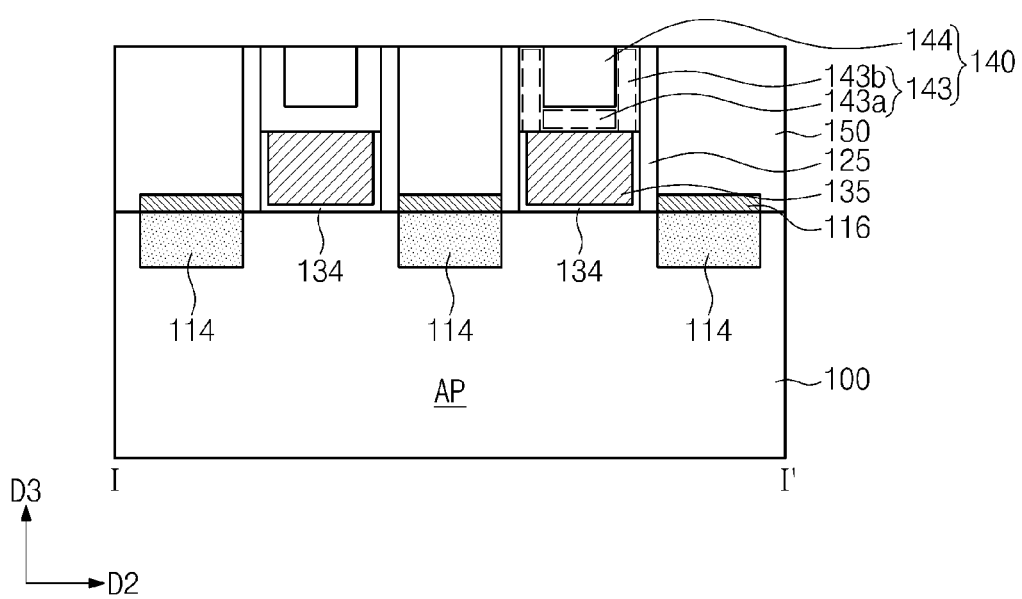

Referring to FIGS. 1 and 3K, a planarization process may be performed on the first and second gate capping layers 141 and 142 to form the gate capping structures 140. The planarization process of the first and second gate capping layers 141 and 142 may be performed using a CMP process. The planarization process may be performed to expose the top surface of the first ILD layer 150. Accordingly, the gate capping structures 140 may have top surfaces that are substantially coplanar with that of the first ILD layer 150. The gate capping structures 140 may be formed on the gate electrodes 135, respectively, and may extend along the gate electrodes 135 or parallel to the first direction D1.

Each of the gate capping structures 140 may include the first gate capping pattern 143, which is a portion of the first gate capping layer 141, and the second gate capping pattern 144, which is a portion of the second gate capping layer 142. The first gate capping pattern 143 may include the horizontally-extended portion 143a, which extends along the gate electrode 135 or parallel to the first direction D1, and the vertically-extended portions 143b, which are provided on both sides of the horizontally-extended portion 143a.

According to example embodiments, the first gate capping pattern 143 may be formed of at least one of materials with high dielectric constant and high density, and thus, it is possible to effectively protect the gate electrodes 135 against an etch damage, which may occur in the subsequent etching process for forming the contact plugs 165. Accordingly, it is possible to effectively form the contact plugs 165 in a self-aligned manner, in the subsequent process. On the other hand, according to another example embodiment, the second gate capping pattern 144 may be formed of at least one of materials with high dielectric constant, whereas the first gate capping pattern 143 may be formed of at least one of materials with low dielectric constant. Thus, the second gate capping pattern 144 may effectively protect the gate electrodes 135 against an etch damage, which may occur vertically above the gate electrodes 135.

Figure 3L:
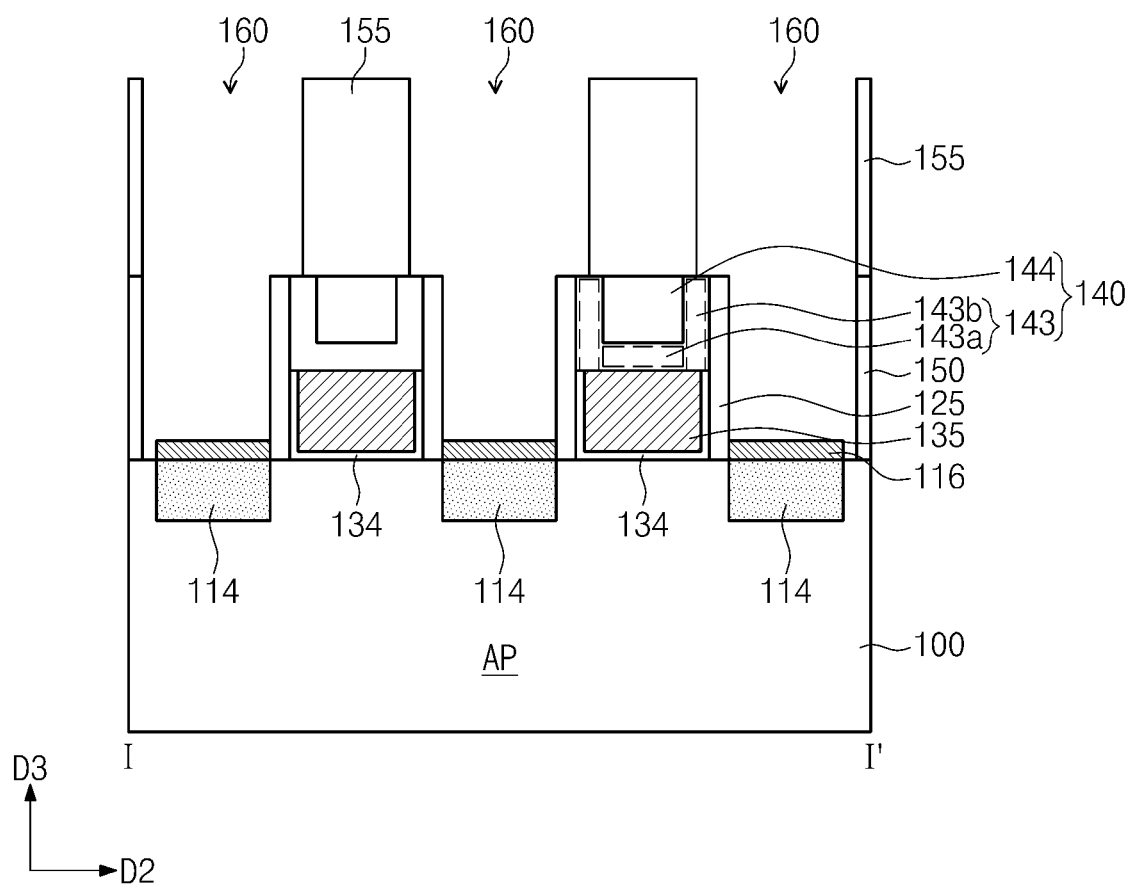

Referring to FIGS. 1 and 3L, the second ILD layer 155 may be formed. The second ILD layer 155 may be formed of or include a silicon oxide layer or a low-k oxide layer. For example, the low-k oxide layer for the second ILD layer 155 may include a carbon-doped silicon oxide layer (e.g., SiCOH). The second ILD layer may be formed using a CVD process.

Thereafter, contact holes 160 may be formed to penetrate the second ILD layer 155 and the first ILD layer 150, and expose top surfaces of the semiconductor capping patterns 116. At least one of the contact holes 160 may expose the top surface of the first gate capping pattern 143 and the top and side surfaces of the spacer structures 125. According to an example embodiment, each of the contact holes 160 may be a self-align contact hole, which is formed to expose the gate capping structures 140 and the spacer structures 125 in a self-aligned manner. For example, the formation of the contact holes 160 may include forming a photoresist pattern (not shown) on the second ILD layer 155 to define positions and shapes of the contact holes 160 and performing an anisotropic etching process using the photoresist pattern as an etch mask. When viewed in a plan view, the photoresist pattern may be formed to have openings (not shown), each of which has the same shape as a corresponding one of the contact holes 160.

Since the gate capping structure 140 (especially, the first gate capping pattern 143) is formed of or include a material having a high etch selectivity with respect to the first and second ILD layers 150 and 155, the gate capping structure 140 can be prevented from being unintentionally etched through the contact holes 160, during the etching process for forming the contact holes 160. In other words, the gate capping structures 140 make it possible to enlarge a process margin in the etching process for forming the contact holes 160.

Referring back to FIGS. 1 and 2, the contact plugs 165 may be formed in the contact holes 160 to be in contact with the semiconductor capping patterns 116. Each of the contact plugs 165 may be formed to be in contact with at least a portion of the gate capping structures 140 and at least a portion of the spacer structures 125. According to an example embodiment, each of the contact plugs 165 may be a self-align contact plug, which is in contact with the gate capping structure 140 and the spacer structure 125 in a self-aligned manner. For example, the formation of the contact plugs 165 may include forming a conductive layer to fill the contact holes 160 and planarizing the conductive layer to expose the top surface of the second ILD layer 155. The conductive layer for the contact plugs 165 may be formed of or include a metallic material (e.g., tungsten). According to an example embodiment, the formation of the conductive layer may include sequentially forming a barrier metal layer (e.g., of metal nitride) and a metal layer (e.g., of tungsten).

[Other Example Embodiment]

Figure 4A:
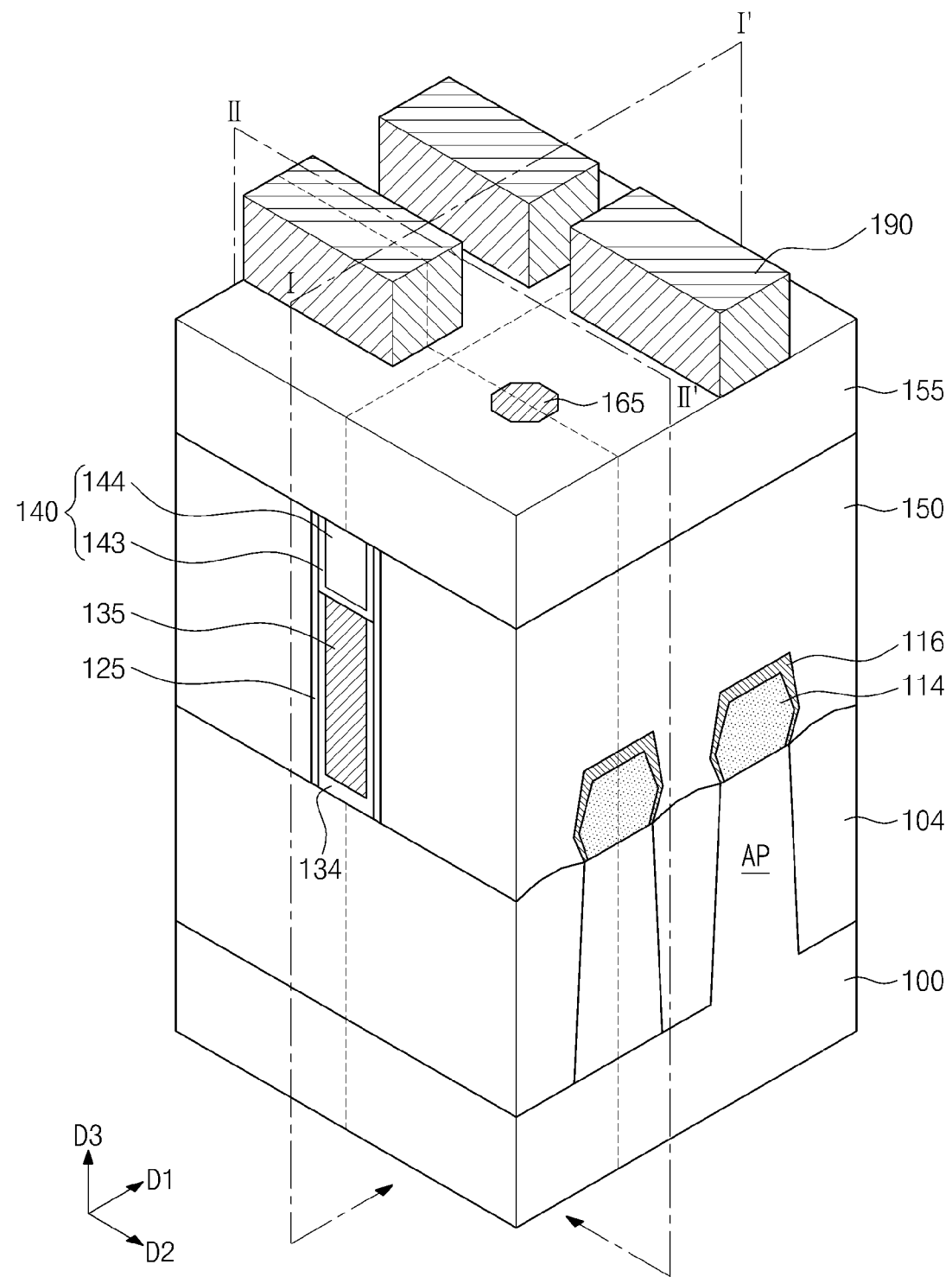
FIG. 4A is a perspective view illustrating a semiconductor device according to another example embodiment.
Figure 4B:
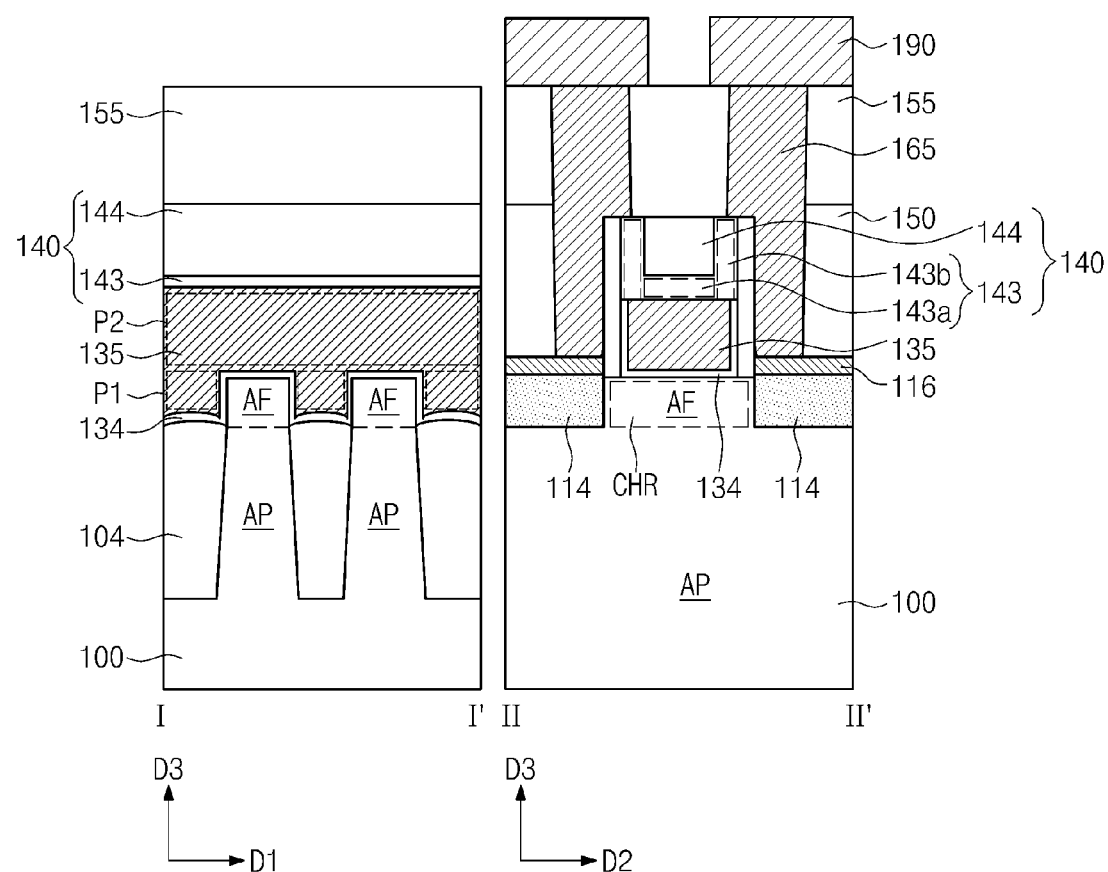
FIG. 4B is a sectional view taken alone lines I-I' and II-II' of FIG. 4A, according to an example embodiment.

FIG. 4A is a perspective view illustrating a semiconductor device according to another example embodiment, and FIG. 4B is a sectional view taken alone lines I-I' and II-II' of FIG. 4A. For concise description, an element previously described with reference to FIGS. 1 and 2 may be identified by a similar or identical reference number without repeating an overlapping description thereof.

Referring to FIGS. 4A and 4B, the device isolation patterns 104 may be provided in the substrate 100 to define the active pattern AP. The device isolation patterns 104 may be arranged along the first direction D1, which is parallel to the top surface of the substrate 100, and each of them may be a line-shaped structure extending along the second direction D2 or crossing the first direction D1. The active pattern AP may be a line-shaped structure extending along the second direction D2 or parallel to the device isolation patterns 104.

The gate electrode 135 may be disposed on the substrate 100 to cross the active pattern AP. The active pattern AP may include active fins AF positioned below the gate electrode 135. The active fins AF may be portions of the active pattern AP, which protrudes toward a direction normal to the top surface of the substrate 100 or the third direction D3. Each of the active fins AF may include a channel region. The gate electrode 135 may be provided to face top and side surfaces of the active fins AF. For example, the gate electrode 135 may include first portions P1, which are provided to face both sidewalls of each of the active fins AF, and a second portion P2, which is provided on the active fins AF to connect the first portions P1 to each other. In other words, the gate electrode 135 may be a line-shaped structure crossing the active fins AF and extending parallel to the first direction D1.

The epitaxial patterns 114 may be provided on portions of the active pattern AP positioned at both sides of the gate electrode 135. The epitaxial patterns 114 may be patterns epitaxially grown from the active pattern AP, and may serve as source and/or drain regions of a field effect transistor. When viewed in a sectional view, top surfaces of the active fins AF may be positioned at a higher level than the bottom surfaces of the epitaxial patterns 114. The top surfaces of the epitaxial patterns 114 may be positioned at the same level as or a higher level than those of the active fins AF. When viewed in a plan view, each of the active fins AF may be positioned between a pair of the epitaxial patterns 114.

The semiconductor capping patterns 116 may be provided on the epitaxial patterns 114. The semiconductor capping patterns 116 may be provided to be in contact with the source and/or drain regions of the field effect transistor. Although not shown, a metal silicide layer may be further provided on the semiconductor capping patterns 116.

The spacer structures 125 may be provided on both sidewalls of the gate electrode 135. The spacer structures 125 may extend along the gate electrode 135 or parallel to the first direction D1.

The gate dielectric layer 134 may be provided between the gate electrode 135 and the active fins AF, and between the gate electrode 135 and the spacer structures 125. The gate dielectric layer 134 may extend along the bottom surface of the gate electrode 135. Accordingly, the gate dielectric layer 134 may be provided to cover the top and side surfaces of the active fins AF. The gate dielectric layer 134 may include a portion horizontally extending from the active fins AF and partially covering top surfaces of the device isolation patterns 104. However, in certain embodiments, the gate dielectric layer 134 may be provided to expose at least a portion of the top surface of the device isolation pattern 104. The exposed portion of the device isolation pattern 104, which is not covered with the gate dielectric layer 134, may be covered by the first ILD layer 150.

The gate capping structure 140 may be provided on the gate electrode 135. The gate capping structure 140 may extend along the gate electrode 135 or parallel to the first direction D1. The gate capping structure 140 may include the first gate capping pattern 143 and the second gate capping pattern 144, which are sequentially stacked on the gate electrode 135. The first gate capping pattern 143 may include the horizontally-extended portion 143a and the vertically-extended portions 143b, which are provided at both sides of the horizontally-extended portion 143a. The gate capping structure 140 in the present embodiment may be configured to have the same features as the gate capping structure 140 previously described with reference to FIGS. 1 and 2.

The first ILD layer 150 may be provided on the substrate 100. The first ILD layer 150 may be provided to cover the spacer structures 125 and the semiconductor capping patterns 116. The first ILD layer 150 may have the top surface that is substantially coplanar with that of the gate capping structure 140. The second ILD layer 155 may be formed on the first ILD layer 150 to cover the gate capping structures 140.

The contact plugs 165 may be provided on the substrate 100 to penetrate the second and first ILD layers 155, and 150 and be in contact with the semiconductor capping patterns 116, respectively. At least one of the contact plugs 165 may be in direct contact with the gate capping structure 140 and the spacer structures 125. However, due to the presence of the gate capping structure 140 and the spacer structures 125, the contact plugs 165 may be electrically and spatially separate from the gate electrode 135. Interconnection lines 190 may be provided on the second ILD layer 155 and may be electrically connected to the contact plugs 165.

FIGS. 5A through 5F are sectional views illustrating a method of fabricating a semiconductor device according to example embodiments. In detail, each of FIGS. 5A through 5F is a sectional view taken along lines I-I' and II-II' of FIG. 4A. For concise description, an element or step previously described with reference to FIGS. 3A through 3L may be identified by a similar or identical reference number without repeating an overlapping description thereof.

Figure 5A:
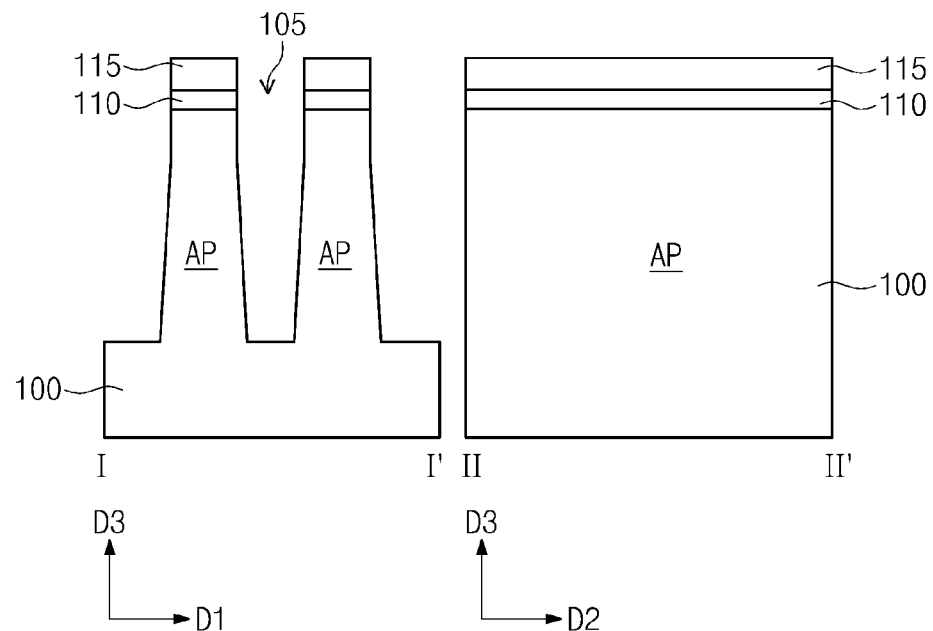
FIGS. 5A through 5F are sectional views illustrating a method of fabricating a semiconductor device, according to other example embodiments.

Referring to FIG. 5A, the substrate 100 may be patterned to form device isolation trenches 105 defining the active patterns AP. The substrate 100 may be or include a semiconductor substrate, which is made of at least one of silicon, germanium, silicon-germanium, or semiconductor compound.

The formation of the device isolation trenches 105 may include forming mask patterns on the substrate 100 and anisotropically etching the substrate 100 using the mask patterns as an etch mask. Each of the mask patterns may include a first mask pattern 110 and a second mask pattern 115, which are sequentially stacked on the substrate 100 and are formed to have an etch selectivity with respect to each other. Each of the device isolation trenches 105 may be formed to have an aspect ratio of at least 5. According to an example embodiment, each of the device isolation trenches 105 may be formed to have a downward tapered shape. Accordingly, each of the active patterns AP may be formed to have an upward tapered shape.

Figure 5B:
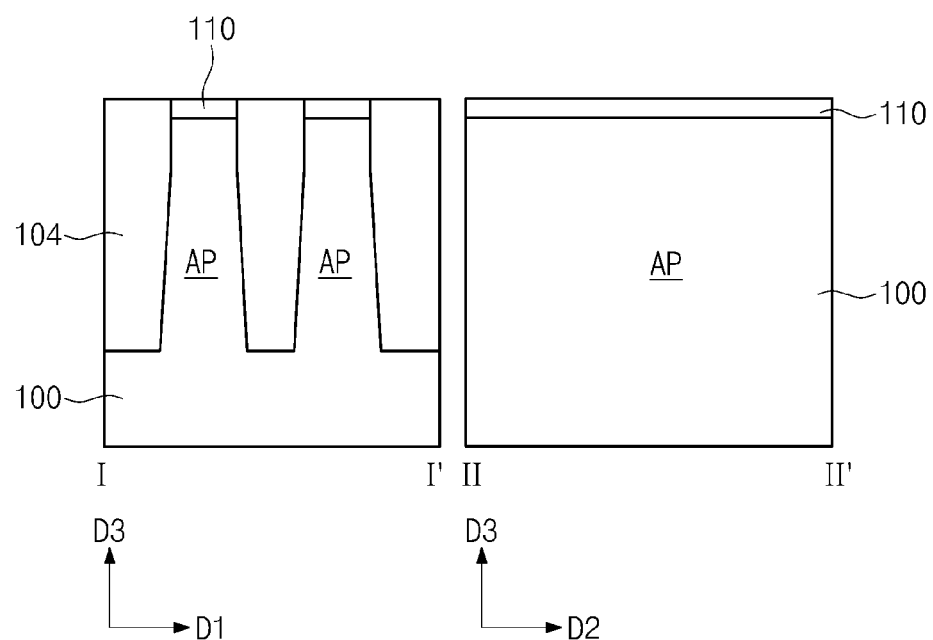

Referring to FIG. 5B, the device isolation patterns 104 may be formed to fill the device isolation trenches 105. The formation of the device isolation patterns 104 may include forming a device isolation layer (not shown) to fill the device isolation trenches 105, and then planarizing the device isolation layer to expose a top surface of the first mask pattern 110. As a result of the planarization process, the device isolation patterns 104 may be formed in the device isolation trenches 105, respectively.

Figure 5C:
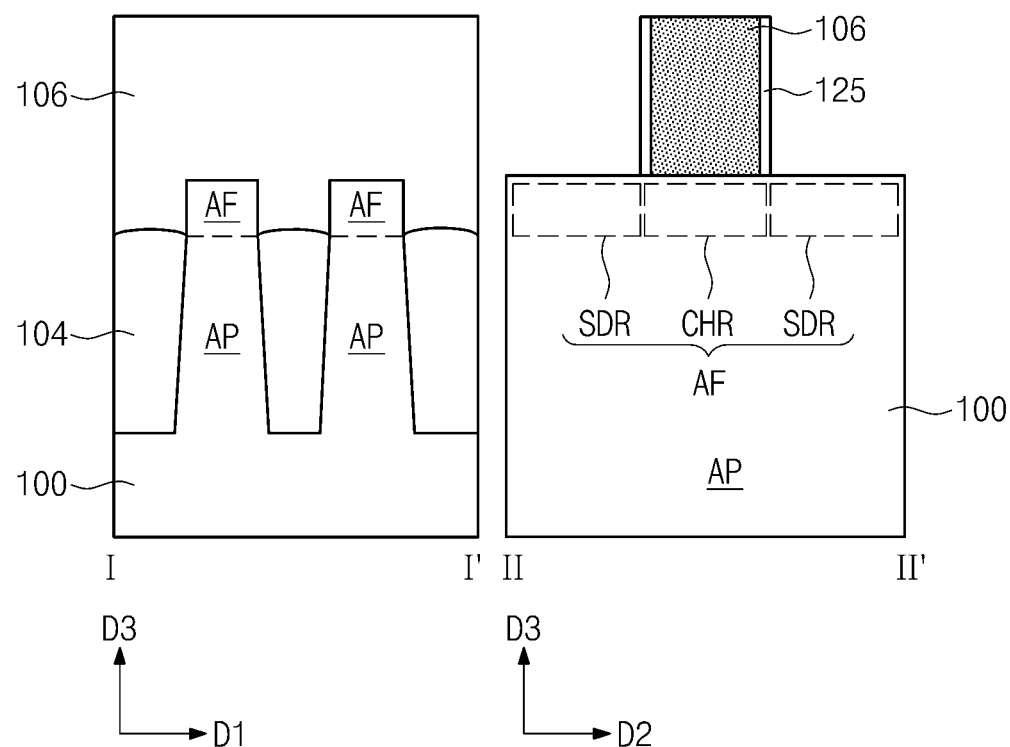

Referring to FIG. 5C, upper portions (hereinafter, active fins AF) of the active patterns AP may be exposed. For example, the exposing of the active fins AF may include recessing top surfaces of the device isolation patterns 104 using a wet etching process. The recessing of the device isolation patterns 104 may be performed using an etch recipe having an etch selectivity with respect to the active pattern AP. The recessing of the device isolation patterns 104 may be performed to remove the first mask pattern 110 and thereby to expose the top surfaces of the active fins AF.

The sacrificial gate pattern 106 and a gate mask pattern (not shown) may be sequentially formed on the active fins AF. The sacrificial gate pattern 106 and the gate mask pattern may be formed by sequentially forming a sacrificial gate layer (not shown) and a gate mask layer (not shown) on the active fins AF and the device isolation patterns 104, and then patterning the sacrificial gate layer and the gate mask layer, similar to the step described with reference to FIG. 3A.

The sacrificial gate pattern 106 may be formed to cross the active fins AF. As shown in FIG. 5C, the sacrificial gate pattern 106 may define a channel region CHR and source/drain regions SDR in each of the active fins AF. For example, the channel region CHR may be a portion of the active fin AF positioned below the sacrificial gate pattern 106, and the source/drain regions SDR may be two portions of the active fin AF, which are positioned at both sides of the sacrificial gate pattern 106, and are horizontally spaced apart from each other by the channel region CHR.

The spacer structures 125 may be formed on both sidewalls of the sacrificial gate pattern 106. Similar to the step described with reference to FIG. 3B, the formation of the spacer structures 125 may be performed by conformally forming a spacer layer on the substrate 100 with the sacrificial gate pattern 106 and then performing an anisotropic etching process on the spacer layer.

Figure 5D:
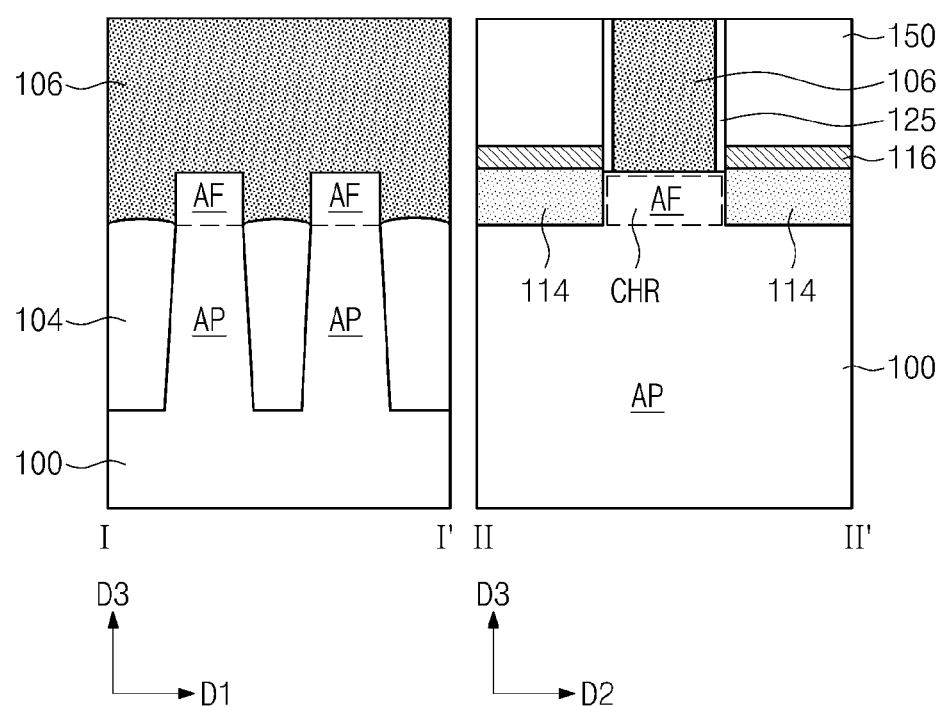

Referring to FIG. 5D, the epitaxial patterns 114 may be formed at both sides of the sacrificial gate pattern 106. The epitaxial patterns 114 may serve as source/drain regions of a field effect transistor. The epitaxial patterns 114 may be formed at positions of the source/drain regions SDR of the active fin AF. For example, the epitaxial patterns 114 may be formed in such a way that the channel region CHR of the active fin AF is interposed between the epitaxial patterns 114.

The formation of the epitaxial patterns 114 may include removing the source/drain regions SDR, and then performing a selective epitaxial growth process using the substrate 100 as a seed layer, similar to the step described with reference to FIG. 3D. The epitaxial patterns 114 may be doped to have a different conductivity type from that of the active pattern AP or have a second conductivity type.

Thereafter, the semiconductor capping patterns 116 may be formed on top surfaces of the epitaxial patterns 114, respectively. The semiconductor capping patterns 116 may be formed of or include the same semiconductor element as the substrate 100 or the epitaxial patterns 114. For example, the semiconductor capping patterns 116 may be formed of or include silicon or silicon-germanium, as described with reference to FIG. 3D.

The first ILD layer 150 may be formed on the structure provided with the semiconductor capping patterns 116. The formation of the first ILD layer 150 may include forming an insulating layer on the substrate 100 to cover the sacrificial gate patterns 106 and then performing a planarization process on the insulating layer to expose the top surfaces of the sacrificial gate patterns 106, similar to the step described with reference to FIG. 3E.

Figure 5E:
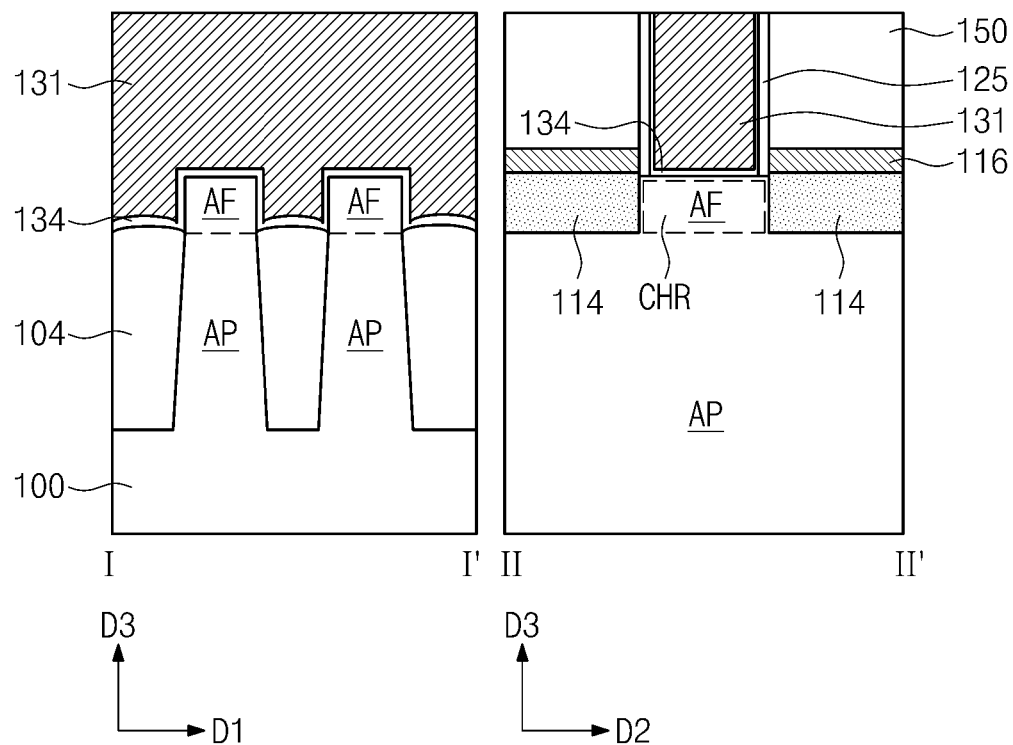

Referring to FIG. 5E, the sacrificial gate patterns 106 may be removed to form gate trenches (not shown), as shown in FIG. 3F. The gate trenches may be formed to expose the active fins AF.

The gate dielectric layer 134 and the preliminary gate electrode 131 may be formed in each of the gate trenches. The gate dielectric layer 134 may be conformally formed to have a thickness that is too small to completely fill the gate trenches. Thereafter, a gate electrode layer (not shown) may be formed on the gate dielectric layer 134 to fill the gate trenches, and the gate electrode layer and the gate dielectric layer 134 may be planarized to expose the top surface of the first ILD layer 150, similar to the step described with reference to FIG. 3G.

Figure 5F:
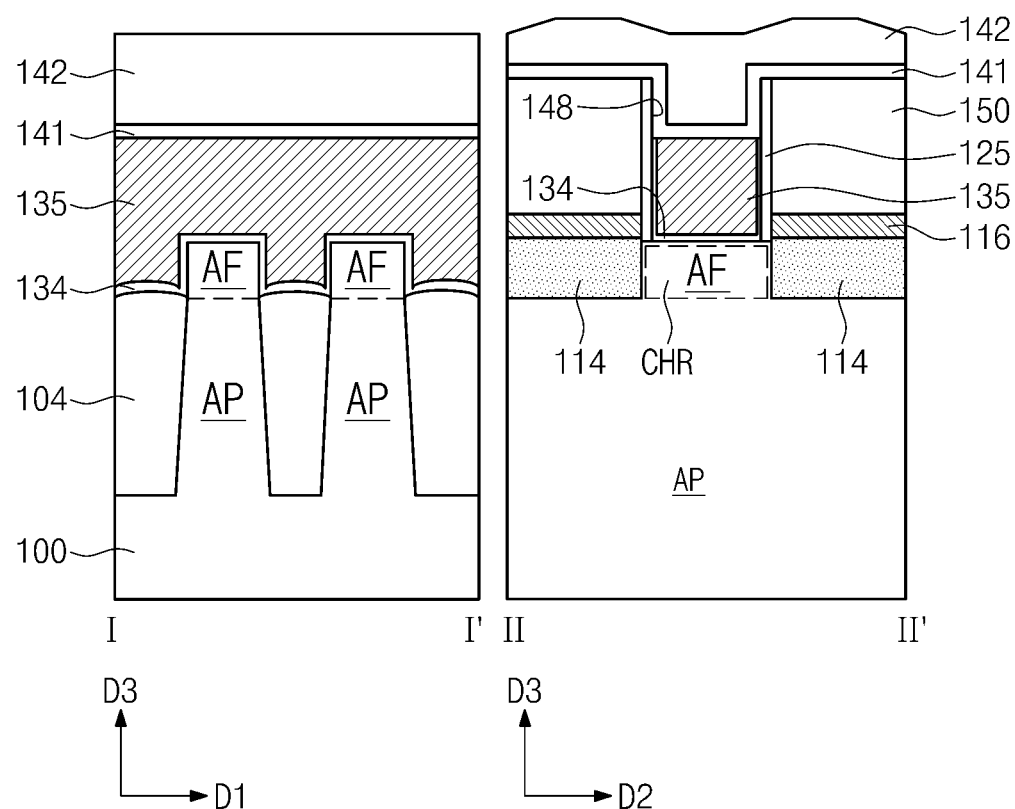

Referring to FIG. 5F, an upper portion of the preliminary gate electrode 131 may be recessed to form the gate electrode 135 and define the recessed region 148, similar to the step described with reference to FIG. 3H.

The first gate capping layer 141 may be formed to cover the top surface of the gate electrode 135. The first gate capping layer 141 may be conformally formed to have a thickness that is too small to completely fill the recessed region 148. For example, similar to the step described with reference to FIG. 3I, the first gate capping layer 141 may be formed using a deposition process with a good step coverage property (e.g., an atomic layer deposition (ALD) process).

The second gate capping layer 142 may be formed on the first gate capping layer 141. The second gate capping layer 142 may be formed by a deposition process having a good gapfill property (e.g., a CVD process). The second gate capping layer 142 may be formed to have a deposited thickness that is greater than two times a thickness of the first gate capping layer 141, similar to the step described with reference to FIG. 3J.

Referring back to FIGS. 4A and 4B, a planarization process may be performed on the first and second gate capping layers 141 and 142, thereby forming the gate capping structure 140. The gate capping structure 140 may have a top surface that is substantially coplanar with that of the first ILD layer 150, as shown in FIG. 3K. The gate capping structure 140 may include the first gate capping pattern 143 and the second gate capping pattern 144, which are sequentially stacked on the gate electrode 135.

The second ILD layer 155 may be formed on the first ILD layer 150 and the gate capping structure 140. Thereafter, the contact holes (not shown) may be formed to penetrate the second ILD layer 155 and the first ILD layer 150 and expose top surfaces of the semiconductor capping patterns 116. At least one of the contact holes may expose the top surface of the first gate capping pattern 143 and the top and side surfaces of the spacer structures 125, as shown in FIG. 3L.

The contact plugs 165 may be formed in the contact holes, respectively, to be in contact with the semiconductor capping patterns 116, respectively. Each of the contact plugs 165 may be a self-align contact plug, which is in contact with the gate capping structure 140 and the spacer structures 125 in a self-aligned manner, as described with reference to FIG. 2. Thereafter, the interconnection lines 190 may be formed on the second ILD layer 155 and may be electrically connected to the contact plugs 165.

Figure 6:
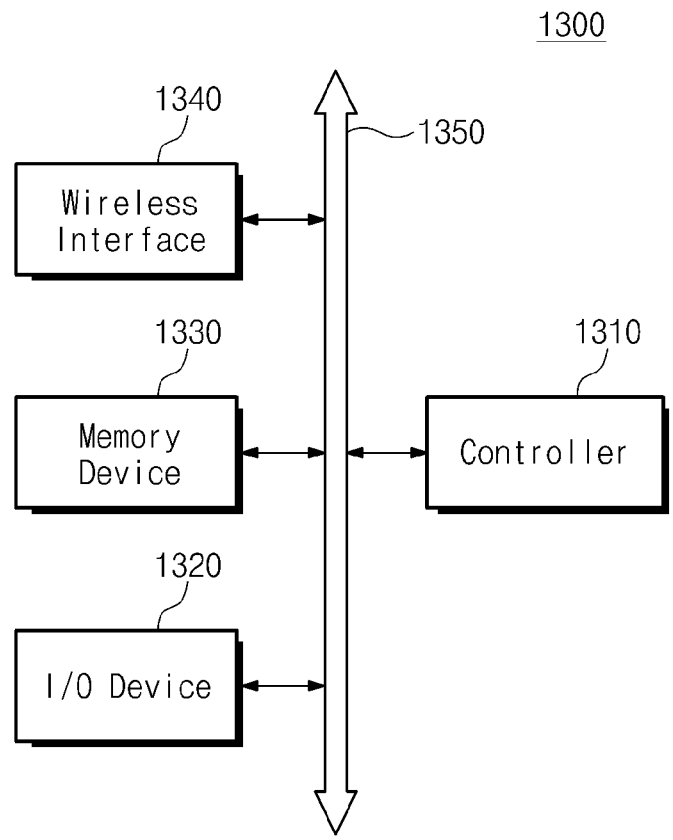
FIGS. 6 and 7 are block diagrams exemplarily illustrating electronic devices including a semiconductor device, according to example embodiments.
Figure 7:
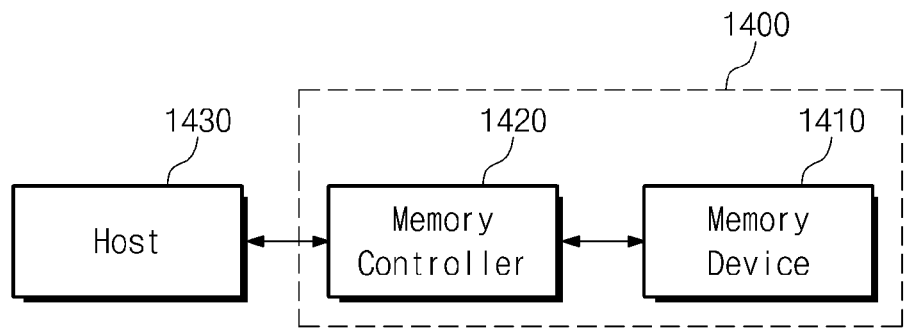

FIGS. 6 and 7 are block diagrams exemplarily illustrating electronic devices including a semiconductor device according to at least one of the above example embodiments.

Referring to FIG. 6, an electronic device 1300 including a semiconductor device according to example embodiments may be used in one of a personal digital assistant (PDA), a laptop computer, a mobile computer, a web tablet, a wireless phone, a cell phone, a digital music player, a wired or wireless electronic device, or a complex electronic device including a combination of such functionalities. The electronic device 1300 may include a controller 1310, an input/output device(s) 1320 (such as a keypad, a keyboard, a display, etc.), a memory 1330, and/or a wireless interface 1340 that are connected/coupled to each other through a bus 1350. The controller 1310 may include, for example, at least one microprocessor, a digital signal process, a microcontroller, etc. The memory 1330 may be configured to store a command code to be used by the controller 1310 and/or user data. The memory 1330 may include a semiconductor device according to one of the above example embodiments. The electronic device 1300 may use a wireless interface 1340 configured to transmit data to and/or receive data from a wireless communication network using a RF (radio frequency) signal. The wireless interface 1340 may include, for example, an antenna, a wireless transceiver, etc. The electronic system 1300 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 7, a memory system including a semiconductor device according to at least one of the above example embodiments will be described. The memory system 1400 may include a memory device 1410 for storing relatively large quantities of data and a memory controller 1420. The memory controller 1420 controls the memory device 1410 so as to read data stored in the memory device 1410 and/or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to one of the above example embodiments.

According to the above example embodiments, two or more gate capping patterns may be used to form contact plugs in a self-aligned manner. For example, the two or more gate capping patterns may be formed to have different properties from each other, and this makes it possible to form the contact plugs in the self-aligned manner and improve operational speed and characteristics of a semiconductor device.

While example embodiments have been particularly shown and described, it will be understood by one of ordinary skill in the art that variations in form and detail may be made therein without departing from the spirit and scope of the inventive concept which is defined by the attached claims.

What is claimed is:

1. A semiconductor device comprising:
    a substrate with an active pattern;
    a gate electrode provided at the active pattern;
    a gate capping structure disposed above the gate electrode;
    spacer structures provided on opposite sidewalls of the gate electrode; and
    contact plugs comprising:
        a first contact plug provided on a first side of the gate electrode; and
        second contact plug provided on a second side opposite to the first side of the gate electrode, wherein the gate capping structure comprises a first gate capping pattern and a second gate capping pattern sequentially stacked on the gate electrode, wherein the first gate capping pattern comprises a horizontally-extended portion extending parallel to a top surface of the substrate and vertically-extended portions extending upward from both edges of the horizontally-extended portion, wherein a top surface of the second gate capping pattern and a top surface of each of the spacer structures are coplanar, and wherein a horizontal distance between the first and the second plugs measured above the top surface of the second capping pattern is greater than a width of the second gate capping pattern.

2. The semiconductor device of claim 1, wherein the vertically-extended portions are continuously connected to the horizontally-extended portion to form a single body.

3. The semiconductor device of claim 1, wherein a bottom surface of the second gate capping pattern is in contact with a top surface of the horizontally-extended portion, and side surfaces of the second gate capping pattern are in contact with the vertically-extended portions, respectively.

4. The semiconductor device of claim 1, further comprising:
a gate dielectric layer interposed between the gate electrode and the substrate; and
epitaxial patterns provided on portions of the active pattern at both sides of the gate electrode,
wherein the contact plugs are connected to the epitaxial patterns, respectively.

5. The semiconductor device of claim 4, further comprising an active fin provided on a top surface of the active pattern,
wherein the gate electrode is provided to cross the active fin, and
wherein the gate dielectric layer extends along a bottom surface of the gate electrode and covers top and side surfaces of the active fin.

6. The semiconductor device of claim 1,
wherein the vertically-extended portions are respectively interposed between the second gate capping pattern and the spacer structures.

7. The semiconductor device of claim 1, wherein the top surface of each of the spacer structures and a top surface of each of the vertically-extended portions are coplanar.

8. The semiconductor device of claim 1, wherein the first gate capping pattern is formed by depositing SiN using an ALD process, and
wherein the second gate capping pattern is formed by depositing SiN using a CVD process.

9. A semiconductor device comprising:
a substrate;
a gate electrode formed at the substrate;
a gate capping structure disposed above the gate electrode and comprising:
a first gate capping pattern; and
a second gate capping pattern provided in the first gate capping pattern;
an interlayer dielectric layer disposed above the gate capping structure;
a contact plug disposed at a side of the gate electrode;
a drain pattern and a source pattern disposed at the substrate separately from the gate electrode; and
spacer structures provided on opposite sidewalls of the gate electrode, wherein the gate capping structure is disposed to electrically and spatially separate the gate electrode from the contact plug, wherein a top surface of the second gate capping pattern and a top surface of each of the spacer structures are coplanar, and wherein an outer-most edge of the contact plug overlaps with the gate capping structure and a portion of the outer-most edge of the contact plug overlapping the gate capping structure is spaced apart from the second gate capping pattern.

10. The semiconductor device of claim 9, wherein the interlayer dielectric layer comprises a silicon-oxide layer, and the gate capping structure comprises at least one of SiON, SiCN, SiCON or SiN.

11. The semiconductor device of claim 9, wherein the first gate capping pattern comprises SiN formed by an atomic layer deposition (ALD) process, and the second gate capping pattern comprises SiN formed by a chemical vapor deposition (CVD) process.

12. The semiconductor device of claim 9, wherein the drain pattern and the source pattern are disposed on an active pattern of the substrate, and
wherein a material forming the drain pattern and the source pattern has a lattice constant different from the active pattern.

13. The semiconductor device of claim 9, wherein the top surface of each of the spacer structures and a top surface of the first gate capping pattern are coplanar.

14. A semiconductor device comprising:
a substrate with an active pattern;
a gate electrode provided at the active pattern;
a gate capping structure disposed above the gate electrode;
contact plugs comprising:
a first contact plug provided on a first side of the gate electrode; and
a second contact plug provided on a second side opposite to the first side of the gate electrode; and
a dielectric layer provided between the first and second contact plugs and above the gate capping structure,
wherein the gate capping structure comprises a first gate capping pattern and a second gate capping pattern sequentially stacked on the gate electrode,
wherein the first gate capping pattern comprises a horizontally-extended portion extending parallel to a top surface of the substrate and vertically-extended portions extending upward from both edges of the horizontally-extended portion,
wherein a bottom surface of the second gate capping pattern is in contact with a top surface of the horizontally-extended portion, and side surfaces of the second gate capping pattern are in contact with the vertically-extended portions, respectively,
wherein top surfaces of the vertically-extended portions and a top surface of the second gate capping pattern are coplanar, and
wherein a width of the dielectric layer provided between the first and second contact plugs is greater than a width of the second gate capping pattern.

15. The semiconductor device of claim 14, further comprising:
an active fin provided on a top surface of the active pattern; and
epitaxial patterns provided on portions of the active pattern at both sides of the gate electrode, wherein the active fin is interposed between the epitaxial patterns, and wherein the epitaxial patterns comprise a material having a lattice constant different from the active pattern.

16. The semiconductor device of claim 14, wherein the first gate capping pattern is formed by depositing SiN using an ALD process, and wherein the second gate capping pattern is formed by depositing SiN using a CVD process.

* * * * *